United States Patent
Tran et al.

(10) Patent No.: US 10,699,779 B2
(45) Date of Patent: Jun. 30, 2020

(54) NEURAL NETWORK CLASSIFIER USING ARRAY OF TWO-GATE NON-VOLATILE MEMORY CELLS

(71) Applicant: Silicon Storage Technology, Inc., San Jose, CA (US)

(72) Inventors: Hieu Van Tran, San Jose, CA (US); Steven Lemke, Boulder Creek, CA (US); Vipin Tiwari, Dublin, CA (US); Nhan Do, Saratoga, CA (US); Mark Reiten, Alamo, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/382,013

(22) Filed: Apr. 11, 2019

(65) Prior Publication Data
US 2019/0237136 A1    Aug. 1, 2019

Related U.S. Application Data

(63) Continuation-in-part of application No. 15/826,345, filed on Nov. 29, 2017.
(Continued)

(51) Int. Cl.
*G11C 16/04*   (2006.01)
*G11C 11/54*   (2006.01)
(Continued)

(52) U.S. Cl.
CPC ............ *G11C 11/54* (2013.01); *G06N 3/0454* (2013.01); *G11C 16/0483* (2013.01);
(Continued)

(58) Field of Classification Search
CPC ..... G11C 11/54; G11C 16/0483; G11C 16/10; G06N 3/0454
(Continued)

(56) References Cited

U.S. PATENT DOCUMENTS

| 4,810,910 A | 3/1989 | Schoellikopf et al. |
| 4,950,917 A | 8/1990 | Holler |

(Continued)

FOREIGN PATENT DOCUMENTS

| EP | 0 566 739 A1 | 10/1993 |
| EP | 0562737 B1 | 6/1998 |

(Continued)

OTHER PUBLICATIONS

U.S. Appl. No. 16/382,034 entitled "Neural Network Classifier Using Array of Four-Gate Non-volatile Memory Cells," Tran, et al, filed Apr. 11, 2019.
(Continued)

*Primary Examiner* — Vu A Le
(74) *Attorney, Agent, or Firm* — DLA Piper LLP (US)

(57) ABSTRACT

A neural network device having a first plurality of synapses that includes a plurality of memory cells. Each memory cell includes a floating gate over a first portion of a channel region and a first gate over a second portion of the channel region. The memory cells are arranged in rows and columns. A plurality of first lines each electrically connect together the first gates in one of the memory cell rows, a plurality of second lines each electrically connect together the source regions in one of the memory cell rows, and a plurality of third lines each electrically connect together the drain regions in one of the memory cell columns. The first plurality of synapses receives a first plurality of inputs as electrical voltages on the plurality of third lines, and provides a first plurality of outputs as electrical currents on the plurality of second lines.

28 Claims, 15 Drawing Sheets

Related U.S. Application Data

(60) Provisional application No. 62/794,492, filed on Jan. 18, 2019, provisional application No. 62/798,417, filed on Jan. 29, 2019.

(51) Int. Cl.
*G06N 3/04* (2006.01)
*H01L 29/423* (2006.01)
*G11C 16/14* (2006.01)
*H01L 27/11521* (2017.01)
*G11C 16/10* (2006.01)

(52) U.S. Cl.
CPC .............. *G11C 16/10* (2013.01); *G11C 16/14* (2013.01); *H01L 27/11521* (2013.01); *H01L 29/42324* (2013.01); *H01L 29/42328* (2013.01)

(58) Field of Classification Search
USPC ...................................................... 365/185.2
See application file for complete search history.

(56) References Cited

U.S. PATENT DOCUMENTS

| | | | |
|---|---|---|---|
| 5,029,130 | A | 7/1991 | Yeh |
| 5,055,897 | A | 10/1991 | Canepa |
| 5,138,576 | A | 8/1992 | Madurawe |
| 5,146,602 | A | 9/1992 | Holler |
| 5,256,911 | A | 10/1993 | Holler |
| 5,264,734 | A | 11/1993 | Holler |
| 5,298,796 | A | 3/1994 | Tawel |
| 5,336,936 | A | 8/1994 | Allen et al. |
| 5,386,132 | A | 1/1995 | Wong |
| 5,469,397 | A | 11/1995 | Hoshino |
| 5,554,874 | A | 9/1996 | Doluca |
| 5,621,336 | A | 4/1997 | Shibata et al. |
| 5,643,814 | A | 7/1997 | Chung |
| 5,721,702 | A | 2/1998 | Briner |
| 5,914,894 | A | 6/1999 | Diorio |
| 6,222,777 | B1 | 4/2001 | Khieu |
| 6,747,310 | B2 | 6/2004 | Fan et al. |
| 6,829,598 | B2 * | 12/2004 | Milev ............... G06N 3/063 706/26 |
| 7,315,056 | B2 | 1/2008 | Klinger et al. |
| 7,868,375 | B2 | 1/2011 | Liu et al. |
| 2002/0089014 | A1 | 7/2002 | Chern |
| 2003/0034510 | A1 | 2/2003 | Liu |
| 2003/0183871 | A1 | 10/2003 | Dugger et al. |
| 2004/0095809 | A1 | 5/2004 | Sakamoto |
| 2004/0125655 | A1 | 7/2004 | Tsai |
| 2004/0156241 | A1 | 8/2004 | Mokhlesi |
| 2005/0087892 | A1 | 4/2005 | Hsu |
| 2006/0104120 | A1 | 5/2006 | Hemink |
| 2006/0170038 | A1 | 8/2006 | Wong |
| 2007/0171756 | A1 | 7/2007 | Lambrache |
| 2009/0103361 | A1 | 4/2009 | Wang |
| 2009/0109760 | A1 | 4/2009 | Nazarian |
| 2009/0154246 | A1 | 6/2009 | Liu |
| 2010/0046299 | A1 | 2/2010 | Roohparvar |
| 2010/0290292 | A1 | 11/2010 | Tanizaki |
| 2012/0087188 | A1 | 4/2012 | Hsieh et al. |
| 2013/0044544 | A1 | 2/2013 | Shiino |
| 2013/0100756 | A1 | 4/2013 | Liao et al. |
| 2014/0054667 | A1 | 2/2014 | Tkachev |
| 2014/0269062 | A1 | 9/2014 | Do |
| 2014/0310220 | A1 * | 10/2014 | Chang ............... G06N 3/063 706/25 |
| 2015/0106315 | A1 | 4/2015 | Birdwell |
| 2015/0138183 | A1 | 5/2015 | Kishi |
| 2015/0213898 | A1 | 7/2015 | Do |
| 2015/0262055 | A1 | 9/2015 | Akopyan |
| 2016/0042790 | A1 | 2/2016 | Tran |
| 2016/0093382 | A1 | 3/2016 | Sakamoto |
| 2016/0133639 | A1 | 5/2016 | Tran |
| 2016/0180945 | A1 | 6/2016 | Ng |
| 2016/0254269 | A1 | 9/2016 | Kim et al. |
| 2017/0337466 | A1 | 11/2017 | Bayat |
| 2017/0337971 | A1 | 11/2017 | Tran et al. |
| 2017/0337980 | A1 | 11/2017 | Guo et al. |
| 2018/0004708 | A1 | 1/2018 | Muralimanohar |
| 2018/0268912 | A1 | 9/2018 | Guo et al. |
| 2018/0293487 | A1 | 10/2018 | Copel et al. |
| 2019/0019538 | A1 | 1/2019 | Li |
| 2019/0042199 | A1 | 2/2019 | Sumbul |
| 2019/0088325 | A1 | 3/2019 | Tiwari et al. |
| 2019/0088329 | A1 | 3/2019 | Tiwari |

FOREIGN PATENT DOCUMENTS

| | | |
|---|---|---|
| JP | H03-018985 A | 1/1991 |
| JP | H03-174679 A | 7/1991 |
| JP | H03-203085 A | 9/1991 |
| JP | 2000-502224 | 2/2000 |

OTHER PUBLICATIONS

U.S. Appl. No. 16/382,045 entitled "Neural Network Classifier Using Array of Three-Gate Non-volatile Memory Cells," Tran, et al, filed Apr. 11, 2019.

U.S. Appl. No. 16/382,051 entitled "Neural Network Classifier Using Array of Stacked Gate Non-volatile Memory Cells," Tran, et al, filed Apr. 11, 2019.

U.S. Appl. No. 16/382,060 entitled "Memory Device and Method for Varying Program State Separation Based Upon Frequency of Use," Tran, et al, filed Apr. 11, 2019.

U.S. Appl. No. 15/826,345 entitled "High Precision and Highly Efficient Tuning Mechanisms . . . Network," Tran, et al., filed Nov. 29, 2017.

U.S. Appl. No. 16/271,673 entitled "Flash Memory Array With Individual Memory Cell Read, Program and Erase," Guo et al., filed Feb. 8, 2019.

U.S. Appl. No. 15/991,890 entitled "Decoders for Analog Neural Memory in Deep Learning Artificial Neural Network," Tran, et al., filed May 29, 2018.

U.S. Appl. No. 16/353,830 entitled "System for Converting Neuron Current Into Neuron Current-Based Time Pulses . . . Network," Tran et al., filed Mar. 14, 2019.

U.S. Appl. No. 16/503,355, filed Jul. 3, 2019, Tran et al.

U.S. Appl. No. 16/354,04, filed Mar. 14, 2019, Tran et al.

U.S. Appl. No. 16/746,852, filed Jan. 18, 2020, Bayat et al.

U.S. Appl. No. 16/353,409, titled "Apparatus and Method for Combining Analog Neural Net With FPGA Routing in a Monolithic Integrated Circuit," filed Mar. 14, 2019.

U.S. Appl. No. 62/797,158, titled "Apparatus and Method for Combining Analog Neural Net With FPGA Routing in a Monolithic Integrated Circuit," filed Jan. 25, 2019.

Jenn-Chyou Bor, et al., "Realization of the CMOS Pulsewidth-Modulation (PWM) Neural Network with On-Chip Learning," IEEE Transactions on Circuits and Systems, Jan. 1998.

Alister Hamilton, et al., "Integrated Pulse Stream Neural Networks: Results, Issues, and Pointers," IEEE Transactions on Neural Networks, May 1992.

Shafiee et al,"Isaac: A Convolutional Neural Network Accelerator With In-Situ Analog Arithmetic in Crossbars;" 2016 ACM/IEEE 43rd Annual International Symposium on Computer Architecture, Seoul, Oct. 2016 [URL:https://www.cs.utah.edu/-rajeev/pubs/isca16.pdf;pp. 1-4.].

Guo, et al., "Temperature-insensitive Analog Vector-by-Matrix Multiplier Based on 55 nm NOR Flash Memory Cells," IEEE Custom Integrated Circuits Conference, Apr. 30, 2017, pp. 1-14.

Lin, et al., "A Novel Voltage-Accumulation Vector-Matrix Multiplication Architecture Using Resistor-shunted Floating Gate Flash Memory Device for Low-power and High-density Neural Network Applications," IEEE International Electron Devices Meeting, Dec. 1, 2018, pp. 2.4.1-2.4.4.

(56) References Cited

OTHER PUBLICATIONS

Bavandpour, et al., "Energy-Efficient Time-Domain Vector-by-Matrix Multiplier for Neurocomputing and Beyond," retrieved from the Internet: url:https://arxiv.org/pgf/1711.1 0673.pdf, pp. 1-6.
Mehrotra, "Elements of Artificial Neural Networks," MIT Press, 1997.

* cited by examiner

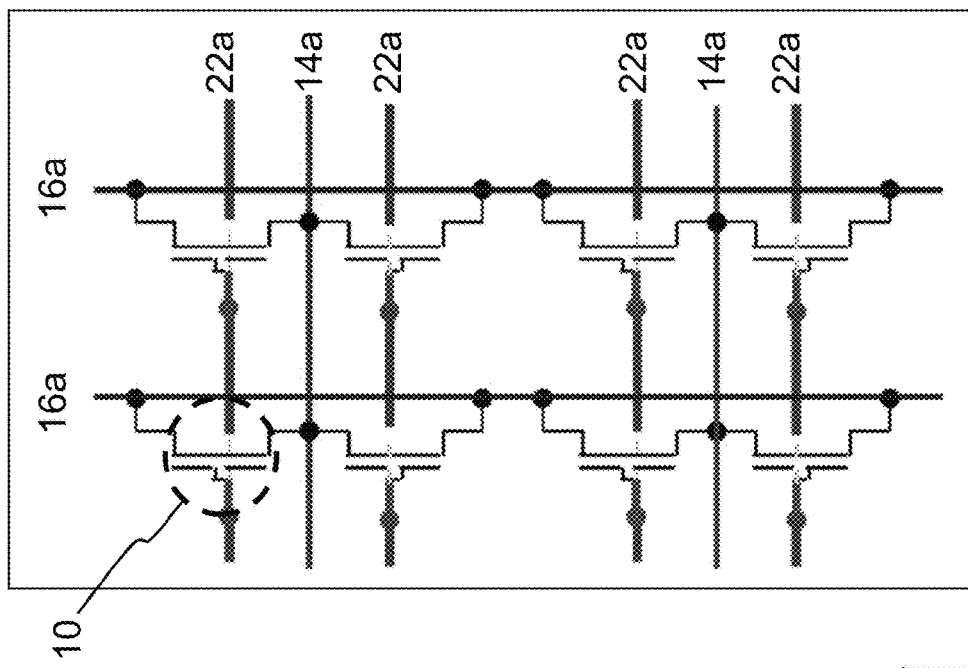
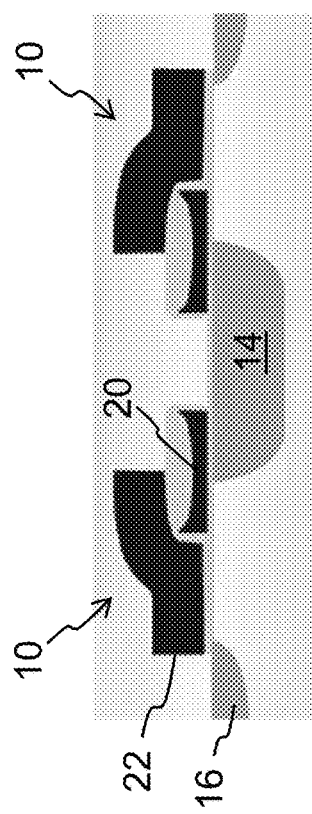
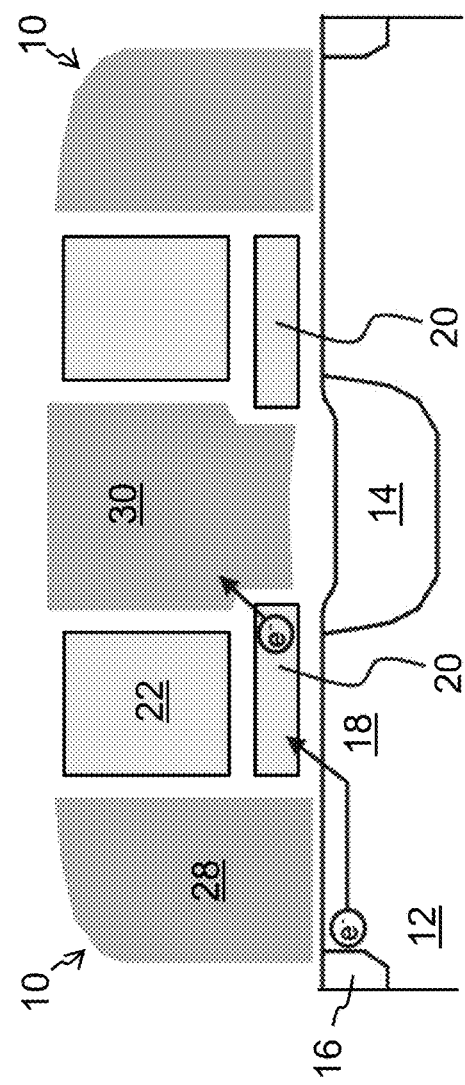

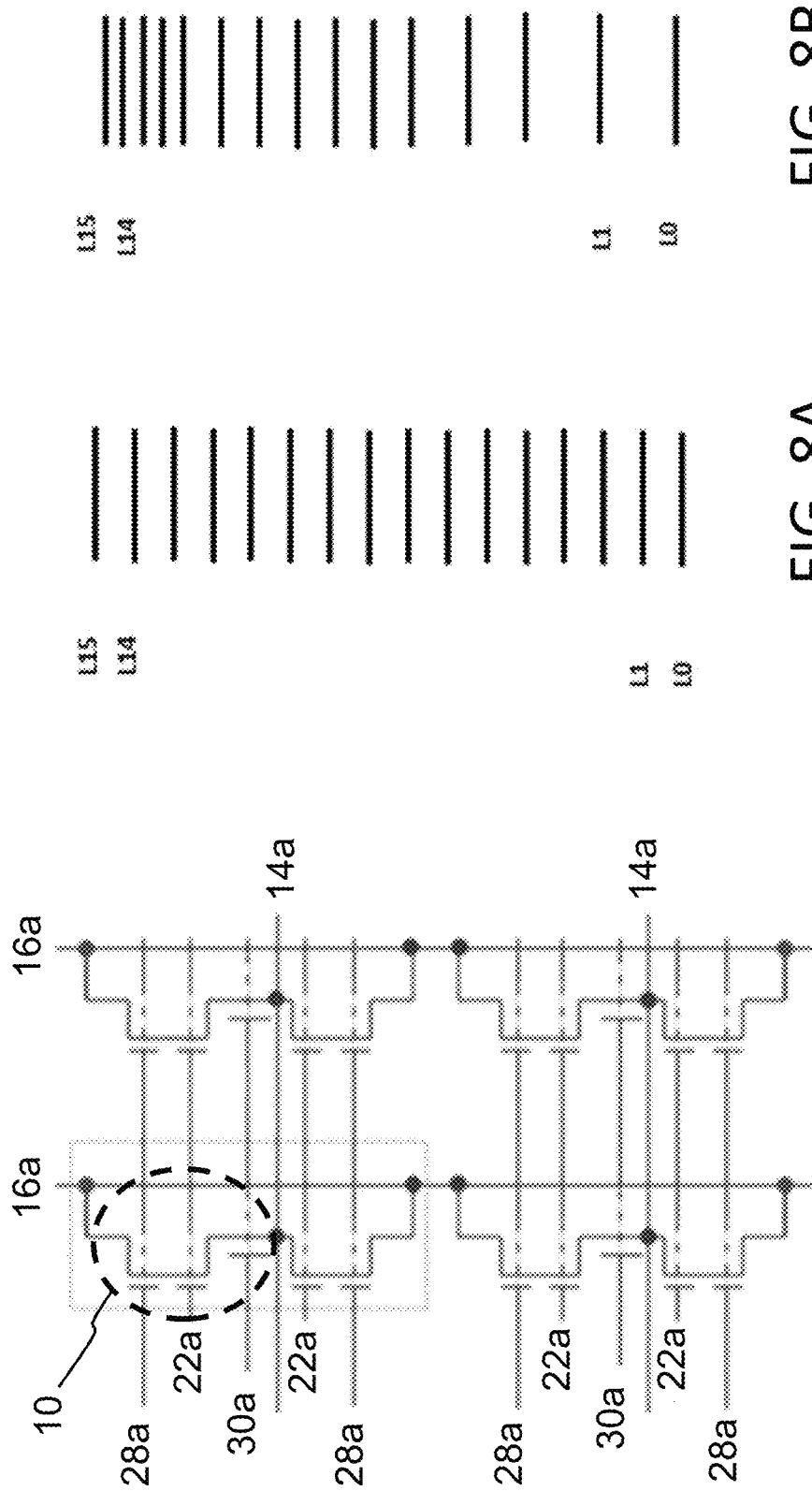

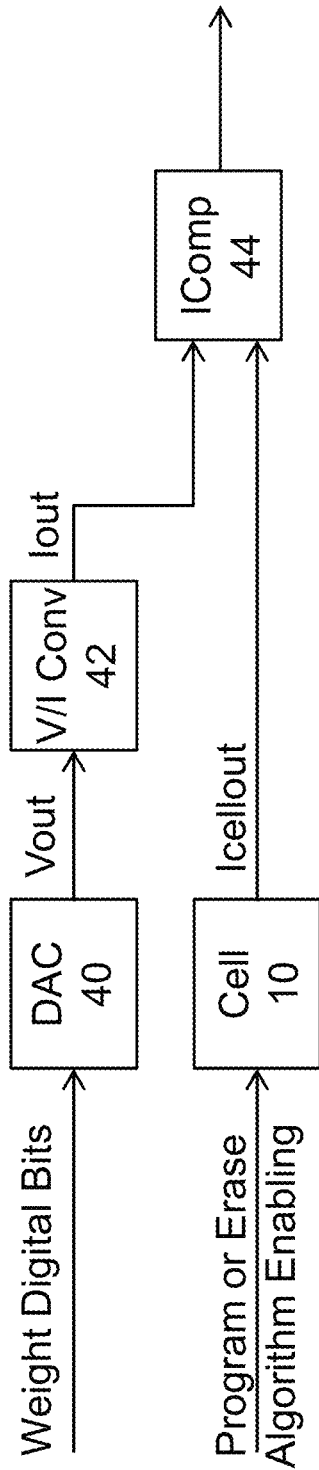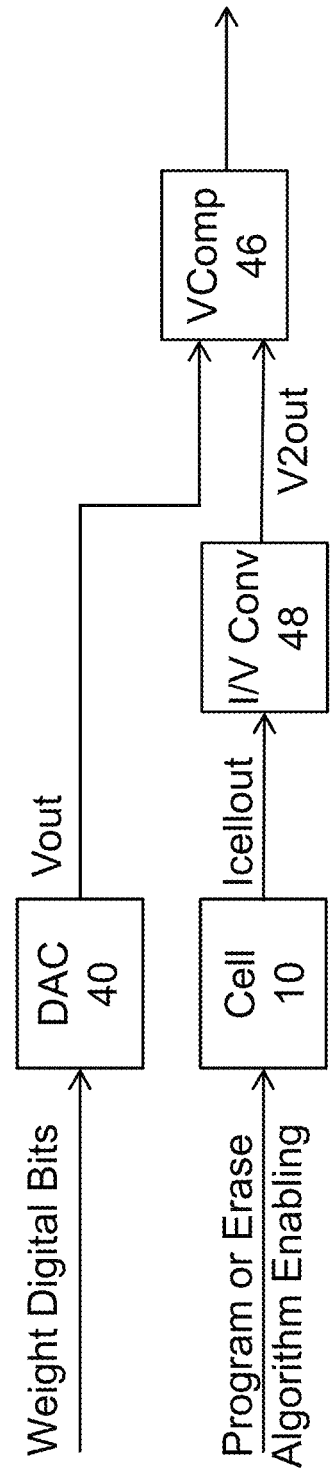
FIG. 10
FIG. 11

NEURAL NETWORK CLASSIFIER USING ARRAY OF TWO-GATE NON-VOLATILE MEMORY CELLS

RELATED APPLICATIONS

This application claims the benefit of U.S. Provisional Application Nos. 62/794,492, filed Jan. 18, 2019 and 62/798,417, filed Jan. 29, 2019; and is a continuation in part of U.S. application Ser. No. 15/826,345, filed Nov. 29, 2017.

FIELD OF THE INVENTION

The present invention relates to neural networks.

BACKGROUND OF THE INVENTION

Artificial neural networks mimic biological neural networks (the central nervous systems of animals, in particular the brain) which are used to estimate or approximate functions that can depend on a large number of inputs and are generally known. Artificial neural networks generally include layers of interconnected "neurons" which exchange messages between each other. FIG. 1 illustrates an artificial neural network, where the circles represent the inputs or layers of neurons. The connections (called synapses) are represented by arrows, and have numeric weights that can be tuned based on experience. This makes neural nets adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

BRIEF SUMMARY OF THE INVENTION

The aforementioned problems and needs are addressed by a neural network device that includes a first plurality of synapses configured to receive a first plurality of inputs and to generate therefrom a first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a first gate having a first portion disposed over and insulated from a second portion of the channel region. Each of the plurality of memory cells is configured to store a weight value corresponding to a number of electrons on the floating gate. The plurality of memory cells are configured to generate the first plurality of outputs based upon the first plurality of inputs and the stored weight values. The memory cells of the first plurality of synapses are arranged in rows and columns. The first plurality of synapses includes a plurality of first lines each electrically connecting together the first gates in one of the rows of the memory cells, a plurality of second lines each electrically connecting together the source regions in one of the rows of the memory cells, and a plurality of third lines each electrically connecting together the drain regions in one of the columns of the memory cells. The first plurality of synapses is configured to receive the first plurality of inputs as electrical voltages on the plurality of third lines, and to provide the first plurality of outputs as electrical currents on the plurality of second lines.

A neural network device can include a first plurality of synapses configured to receive a first plurality of inputs and to generate therefrom a first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a first gate having a first portion disposed over and insulated from a second portion of the channel region. Each of the plurality of memory cells is configured to store a weight value corresponding to a number of electrons on the floating gate. The plurality of memory cells are configured to generate the first plurality of outputs based upon the first plurality of inputs and the stored weight values. The memory cells of the first plurality of synapses are arranged in rows and columns. The first plurality of synapses includes a plurality of first lines each electrically connecting together the first gates in one of the rows of the memory cells, a plurality of second lines each electrically connecting together the source regions in one of the rows of the memory cells, and a plurality of third lines each electrically connecting together the drain regions in one of the columns of the memory cells. The first plurality of synapses is configured to receive the first plurality of inputs as electrical voltages on the plurality of second lines or on the plurality of first lines, and to provide the first plurality of outputs as electrical currents on the plurality of third lines.

A neural network device can include a first plurality of synapses configured to receive a first plurality of inputs and to generate therefrom a first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a first gate having a first portion disposed over and insulated from a second portion of the channel region. Each of the plurality of memory cells is configured to store a weight value corresponding to a number of electrons on the floating gate. The plurality of memory cells are configured to generate the first plurality of outputs based upon the first plurality of inputs and the stored weight values. The memory cells of the first plurality of synapses are arranged in rows and columns. The first plurality of synapses includes a plurality of first lines each electrically connecting together the first gates in one of the rows of the memory cells, a plurality of second lines each electrically connecting together the source regions in one of the rows of the memory cells, a plurality of third lines each electrically connecting together the drain regions in one of the columns of the memory cells, and a plurality of transistors each electrically connected in series with one of the third lines. The first plurality of synapses is configured to receive the first plurality of inputs as electrical voltages on gates of the plurality of transistors, and to provide the first plurality of outputs as electrical currents on the plurality of second lines.

A neural network device can include a first plurality of synapses configured to receive a first plurality of inputs and to generate therefrom a first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a first gate having a first portion disposed over and insulated from a second portion of the channel region. Each of the plurality of memory cells is configured to store a weight value corresponding to a number of electrons on the floating gate. The plurality of memory cells are configured to generate the first plurality of outputs based upon the first plurality of inputs and the stored weight values. The memory cells of the first plurality of synapses are arranged in rows and columns. The first plurality of synapses includes a plurality of first lines each electrically connecting together the first gates in one of the columns of the memory cells, a plurality of second lines each electrically connecting together the source regions in one of the rows of the memory cells, and a plurality of third lines each electrically connecting together the drain regions in one of the columns of the memory cells. The first plurality of synapses is configured to receive the first plurality of inputs as electrical voltages on the plurality of first lines, and to provide the first plurality of outputs as electrical currents on the plurality of second lines.

Other objects and features of the present invention will become apparent by a review of the specification, claims and appended figures.

BRIEF DESCRIPTION OF THE DRAWINGS

FIG. 4 is a side cross sectional view of a conventional 2-gate non-volatile memory cell.

FIG. 5 is a diagram illustrating a conventional array architecture for the memory cell of FIG. 4.

FIG. 6 is a side cross sectional view of a conventional 4-gate non-volatile memory cell.

FIG. 7 is a diagram illustrating a conventional array architecture for the memory cell of FIG. 6.

FIG. 8A is a diagram illustrating neural network weight level assignments that are evenly spaced.

FIG. 8B is a diagram illustrating neural network weight level assignments that are unevenly spaced.

FIG. 10 is a block diagram illustrating weight mapping using current comparison.

FIG. 11 is a block diagram illustrating weight mapping using voltage comparison.

DETAILED DESCRIPTION OF THE INVENTION

Figure 2:
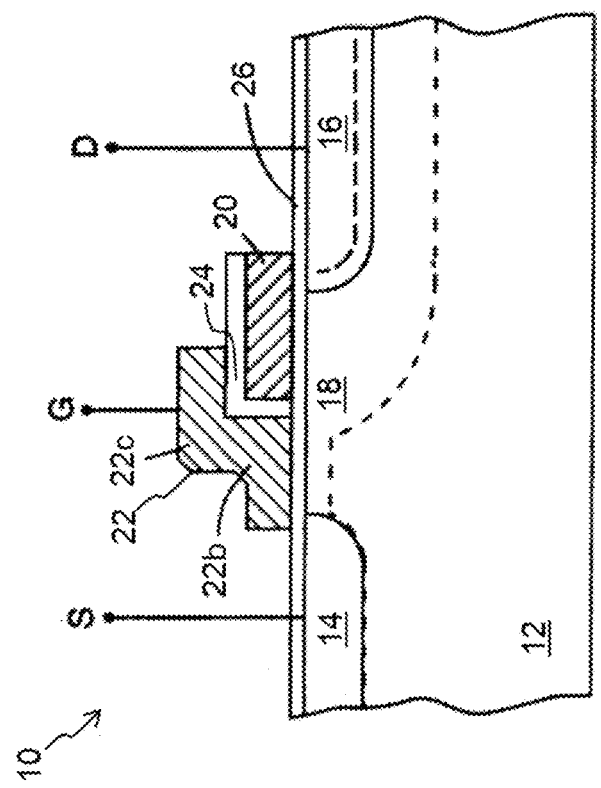
FIG. 2 is a side cross sectional view of a conventional 2-gate non-volatile memory cell.
Figure 1:
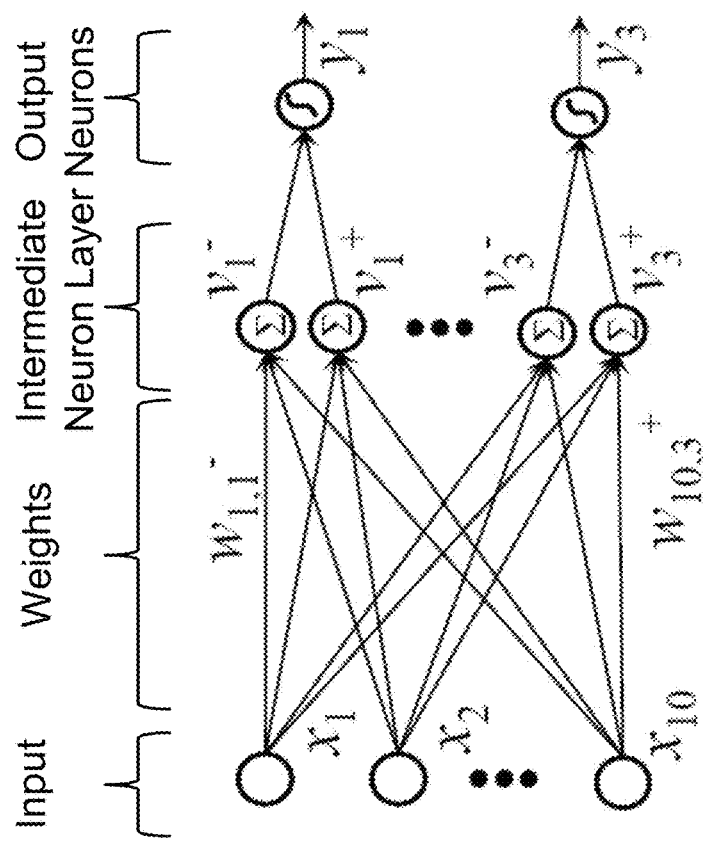
FIG. 1 is a diagram that illustrates an artificial neural network.

The artificial neural networks of the present invention utilize a combination of CMOS technology and non-volatile memory arrays. Digital non-volatile memories are well known. For example, U.S. Pat. No. 5,029,130 ("the '130 patent") discloses an array of split gate non-volatile memory cells, and is incorporated herein by reference for all purposes. The memory cell disclosed in the '130 patent is shown in FIG. 2 as memory cell 10. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 (i.e., a second, channel controlling gate) has a first portion 22b that is disposed over and insulated from (and controls the conductivity of) a second portion of the channel region 18, and a second portion 22c that extends up and over the floating gate 20. The floating gate 20 and control gate 22 are insulated from the substrate 12 by a gate oxide 26.

The memory cell 10 is erased (where electrons are removed from the floating gate 20) by placing a high positive voltage on the control gate 22, which causes electrons on the floating gate 20 to tunnel through an intermediate insulation 24 from the floating gate 20 to the control gate 22 via Fowler-Nordheim tunneling.

The memory cell 10 is programmed (where electrons are placed on the floating gate 20) by placing a positive voltage on the control gate 22, and a positive voltage on the drain 16. Electron current will flow from the source 14 towards the drain 16. The electrons will accelerate and become heated when they reach the gap between the control gate 22 and the floating gate 20. Some of the heated electrons will be injected through the gate oxide 26 onto the floating gate 20 due to the attractive electrostatic force from the floating gate 20.

The memory cell 10 is read by placing positive read voltages on the drain 16 and control gate 22 (which turns on the portion of the channel region under the control gate). If the floating gate 20 is positively charged (i.e. erased of electrons and capacitively coupled to a positive voltage on the drain 16), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region 18 under the floating gate 20 is mostly or entirely turned off, and current will not flow (or there will be little flow) across the channel region 18, which is sensed as the programmed or "0" state.

Figure 3:
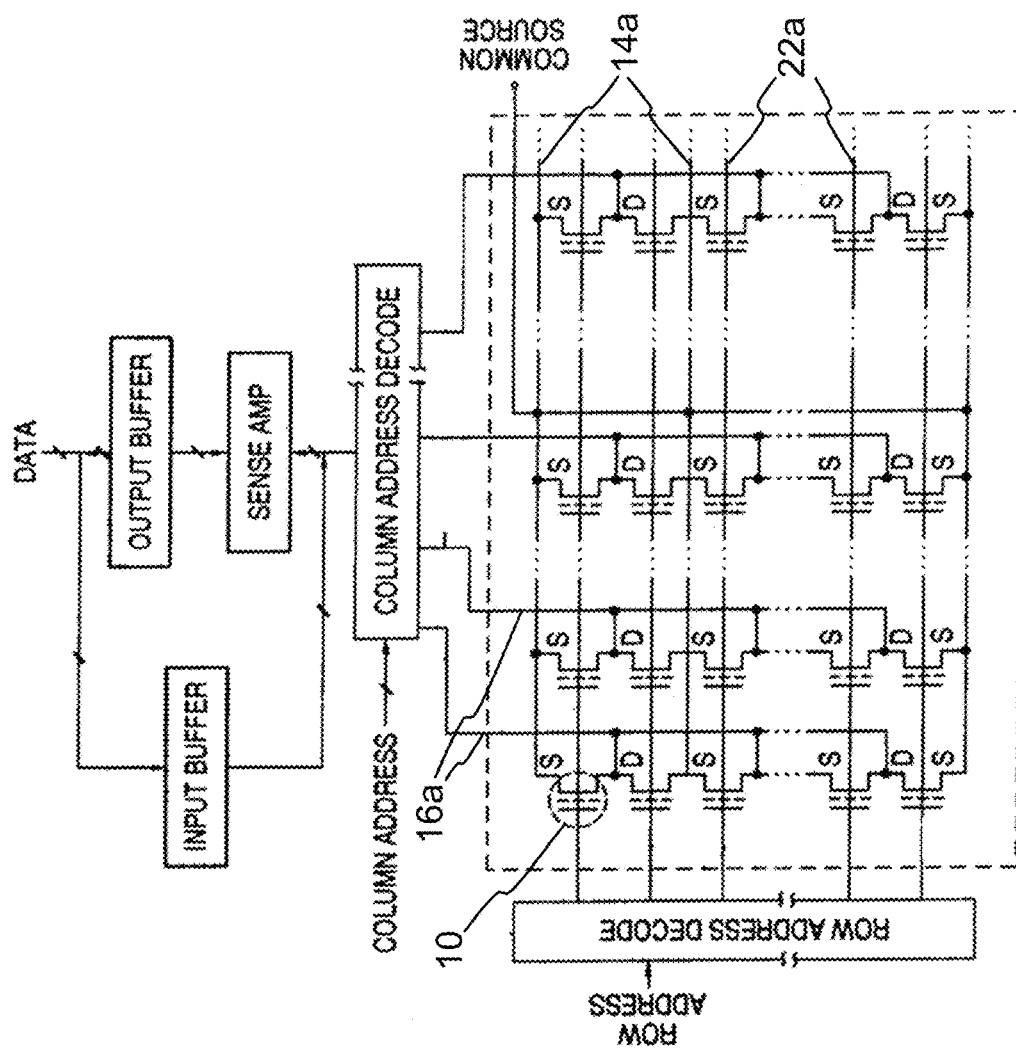
FIG. 3 is a diagram illustrating a conventional array architecture for the memory cell of FIG. 2.

The architecture of a conventional array architecture for the memory cell 10 is shown in FIG. 3. The memory cells 10 are arranged in rows and columns. In each column, the memory cells are arranged end to end in mirror fashion, so that they are formed as pairs of memory cells each sharing a common source region 14 (S), and each adjacent set of memory cell pairs sharing a common drain region 16 (D). All the source regions 14 for any given row of memory cells are electrically connected together by a source line 14a. All the drain regions 16 for any given column of memory cells are electrically connected together by a bit line 16a. All the control gates 22 for any given row of memory cells are electrically connected together by a control gate line 22a. Therefore, while the memory cells can be individually programmed and read, memory cell erasure is performed row by row (each row of memory cells is erased together, by the application of a high voltage on the control gate line 22a). If a particular memory cell is to be erased, all the memory cells in the same row are also erased.

Those skilled in the art understand that the source and drain can be interchangeable, where the floating gate 20 can extend partially over the source 14 instead of the drain 16, as shown in FIG. 4. FIG. 5 best illustrates the corresponding memory cell architecture, including the memory cells 10, the source lines 14a, the bit lines 16a, and the control gate lines 22a. As is evident from the figures, memory cells 10 of the same row share the same source line 14a and the same control gate line 22a, while the drain regions of all cells of the same column are electrically connected to the same bit line 16a. The array design is optimized for digital applications, and permits individual programming of the selected cells, e.g., by applying 1.6 V and 7.6 V to the selected control gate line 22a and source line 14a, respectively, and grounding the selected bit line 16a. Disturbing the non-selected memory cell in the same pair is avoided by applying a voltage greater than 2 volts on the unselected bit lines 16a and grounding the remaining lines. The memory cells 10 cannot be erased individually because the process responsible for erasure (the Fowler-Nordheim tunneling of electrons from the floating gate 20 to the control gate 22) is only weakly affected by the drain voltage (i.e., the only voltage which may be different for two adjacent cells in the row direction sharing the same source line 14a). A non-limiting example of operational voltages can include:

TABLE 1

|  | CG 22a | BL 16a | SL 14a |
| --- | --- | --- | --- |
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 uA | 9-10 V |

Read 1 is a read mode in which the cell current comes out on the bit line. Read 2 is a read mode in which the cell current comes out on the source line.

Split gate memory cells having more than two gates are also known. For example, memory cells having source region 14, drain region 16, floating gate 20 over a first portion of channel region 18, a select gate 28 (i.e., a second, channel controlling gate) over a second portion of the channel region 18, a control gate 22 over the floating gate 20, and an erase gate 30 over the source region 14 are known, as shown in FIG. 6 (see for example U.S. Pat. No. 6,747,310, which is incorporated herein by reference for all purposes). Here, all gates are non-floating gates except floating gate 20, meaning that they are electrically connected or connectable to a voltage or current source. Programming is shown by heated electrons from the channel region 18 injecting themselves onto the floating gate 20. Erasing is shown by electrons tunneling from the floating gate 20 to the erase gate 30.

The architecture for a four-gate memory cell array can be configured as shown in FIG. 7. In this embodiment, each horizontal select gate line 28a electrically connects together all the select gates 28 for that row of memory cells. Each horizontal control gate line 22a electrically connects together all the control gates 22 for that row of memory cells. Each horizontal source line 14a electrically connects together all the source regions 14 for two rows of memory cells that share the source regions 14. Each bit line 16a electrically connects together all the drain regions 16 for that column of memory cells. Each erase gate line 30a electrically connects together all the erase gates 30 for two rows of memory cells that share the erase gate 30. As with the previous architecture, individual memory cells can be independently programmed and read. However, there is no way to erase memory cells individually. Erasing is performed by placing a high positive voltage on the erase gate line 30a, which results in the simultaneous erasing of both rows of the memory cells that share the same erase gate line 30a. Exemplary, non-limiting operating voltages can include those in Table 2 below (in this embodiment, select gate lines 28a can be referred to as word lines WL):

TABLE 2

|  | SG 28a | BL 16a | CG 22a | EG 30a | SL 14a |
| --- | --- | --- | --- | --- | --- |
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | -0.5 V/0 V | 0 V | 0 V/-8 V | 8-12 V | 0 V |
| Program | 1 V | 1 uA | 8-11 V | 4.5-5 V | 4.5-5 V |

Read 1 is a read mode in which the cell current comes out on the bit line. Read 2 is a read mode in which the cell current comes out on the source line.

In order to utilize the above described non-volatile memory arrays in neural networks, two modifications may be made. First, the lines may be reconfigured so that each memory cell can be individually programmed, erased and read without adversely affecting the memory state of other memory cells in the array, as further explained below. Second, continuous (analog) programming of the memory cells may be provided. Specifically, the memory or program state (i.e. charge on the floating gate as reflected by the number of electrons on the floating gate) of each memory cells in the array can be continuously changed from a fully erased state to a fully programmed state, and vice versa, independently and with minimal disturbance of other memory cells. This means the cell storage is analog or at the very least can store one of many discrete values, which allows for very precise and individual tuning of all the cells in the memory array, and which makes the memory array ideal for storing and making fine tuning adjustments to the synapsis weights of the neural network.

Memory Cell Programming and Storage

The neural network weight level assignments as stored in the memory cells can be evenly spaced as shown in FIG. 8A, or unevenly spaced as shown in FIG. 8B. Programming of the non-volatile memory cells can be implemented using a bidirectional tuning algorithm such as that shown in FIG. 9. Icell is the read current of the target cell being programmed, and Itarget is the desired read current when the cell is ideally programmed. The target cell read current Icell is read (step 1) and compared to the target read current Itarget (step 2). If the target cell read current Icell is greater than the target read current Itarget, a programming tuning process is performed (step 3) to increase the number of electrons on the floating gate 20 (in which a look up table or a silicon based approximate function may be used to determine the desired initial and increment programming voltage VCG on the control gate 22) (steps 3a-3b), which can be repeated as necessary (step 3c). If the target cell read current Icell is less than the target read current Itarget, an erase tuning process is performed (step 4) to decrease the number of electrons on the floating gate 20 (in which a look up table or a silicon based approximate function may be used to determine the desired initial and increment erase voltage VEG on the erase gate 30) (steps 4a-4b), which can be repeated as necessary (step 4c). If a programming tuning process overshoots the target read current, then an erase tuning process is performed (step 3d and starting with step 4a), and vice versa (step 4d and starting with step 3a), until the target read current is achieved (within an acceptable delta value).

Figure 9:
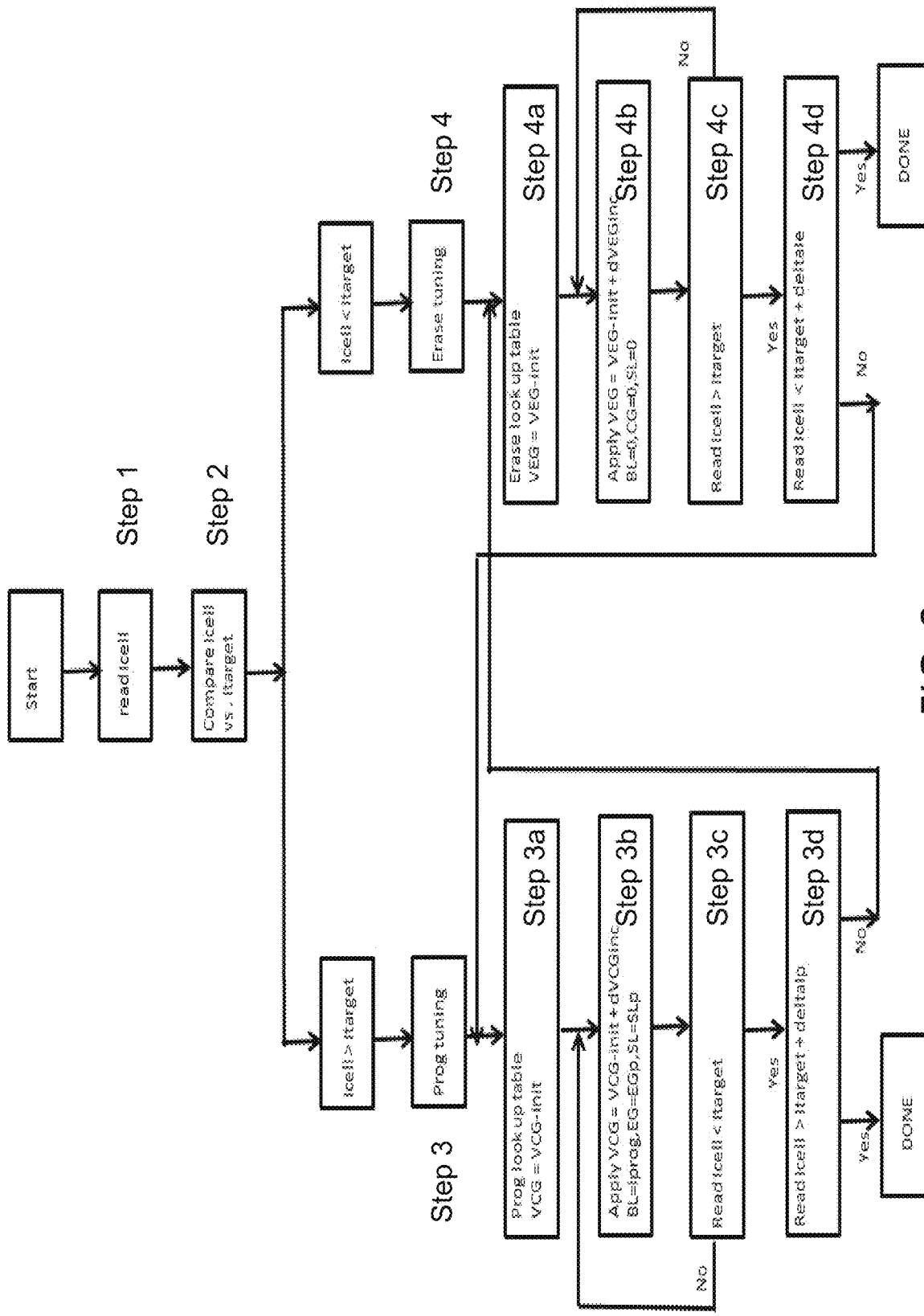
FIG. 9 is a flow diagram illustrating a bidirectional tuning algorithm.

Programming of the non-volatile memory cells can instead be implemented using a unidirectional tuning algorithm using programming tuning. With this algorithm, the memory cell 10 is initially fully erased, and then the programming tuning steps 3a-3c in FIG. 9 are performed until the read current of the target memory cell 10 reaches the target threshold value. Alternately, the tuning of the non-volatile memory cells can be implemented using the unidirectional tuning algorithm using erasing tuning. In this approach, the memory cell is initially fully programmed, and then the erasing tuning steps 4a-4c in FIG. 9 are performed until the read current of the target memory cell reaches the target threshold value.

FIG. 10 is a diagram illustrating weight mapping using current comparison. The weight digital bits (e.g., 5-bit weight for each synapsis, representing the target digital weight for the memory cell) are input to a digital-to-analog converter (DAC) 40, which converts the bits to voltage Vout (e.g., 64 voltage levels—5 bits). Vout is converted to a current Iout (e.g. 64 current levels—5 bits) by voltage-to-current converter V/I Conv 42. The current Iout is supplied to a current comparator IComp 44. Program or erase algorithm enabling are input to the memory cell 10 (for example, erase: incrementing EG voltage; or program: increment CG voltage). The output memory cell current Icellout (i.e. from a read operation) is supplied to the current comparator IComp 44. The current comparator IComp 44 compares the memory cell current Icellout with the current Iout derived from the weight digital bits to produce a signal indicative of the weight stored in the memory cell 10.

FIG. 11 is a diagram illustrating weight mapping using voltage comparison. The weight digital bits (e.g., 5-bit weight for each synapsis) are input to a digital-to-analog converter (DAC) 40, which converts the bits to voltage Vout (e.g., 64 voltage levels—5 bits). Vout is supplied to a voltage comparator VComp 46. Program or erase algorithm enabling are input to the memory cell 10 (for example, erase: incrementing EG voltage; or program: increment CG voltage). The output memory cell current Icellout is supplied to current-to-voltage converter IN Conv 48 for conversion to a voltage V2out (e.g. 64 voltage levels—5 bits). Voltage V2out is supplied to voltage comparator VComp 46. The voltage comparator VComp 46 compares the voltages Vout and V2 out to produce a signal indicative of the weight stored in the memory cell 10.

Another embodiment for weight mapping comparison uses variable pulse widths (i.e., pulse width is proportional or inversely proportional to the value of weight) for the input weight and/or the output of the memory cell. In yet another embodiment for weight mapping comparison, digital pulses (e.g., pulses generated from clocks, where the number of pulses are proportional or inversely proportional to the value of weight) are used for the input weight and/or the output of the memory cell.

Neural Networks Employing Non-Volatile Memory Cell Array

Figure 12:
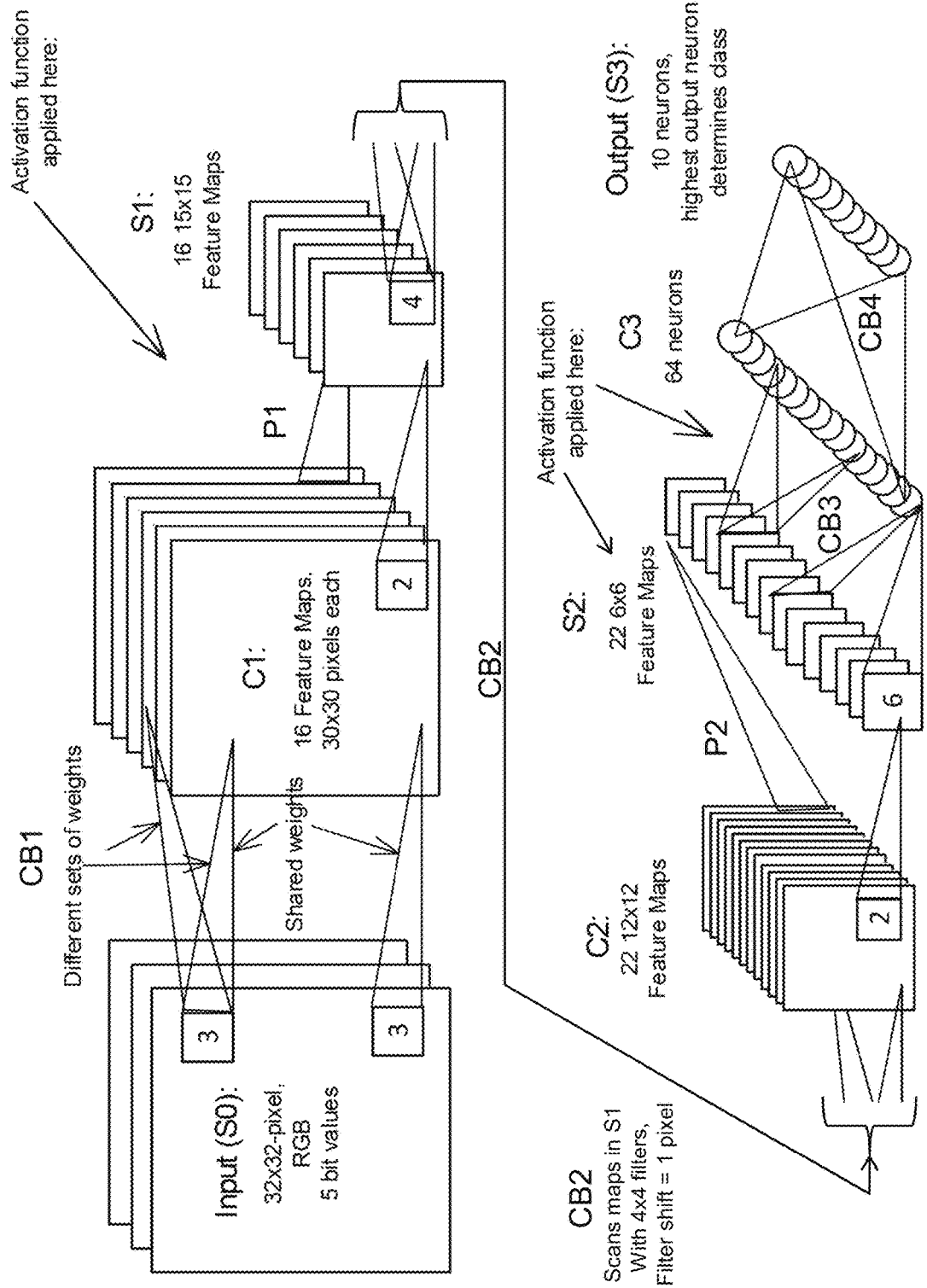
FIG. 12 is a diagram illustrating the different levels of an exemplary neural network utilizing a non-volatile memory array.

FIG. 12 conceptually illustrates a non-limiting example of a neural network utilizing a non-volatile memory array. This example uses the non-volatile memory array neural net for a facial recognition application, but any other appropriate application could be implemented using a non-volatile memory array based neural network. S0 is the input layer, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated synapse. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses and associated neurons in CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function is applied at the synapses CB3 going from layer S2 to layer C3, where every neuron in layer C3 connects to every map in layer S2. At layer C3, there are 64 neurons. The synapses CB4 going from layer C3 to the output layer S3 fully connects S3 to C3. The output at layer S3 includes 10 neurons, where the highest output neuron determines the class. This output could, for example, be indicative of an identification or classification of the contents of the original image.

Figure 13:
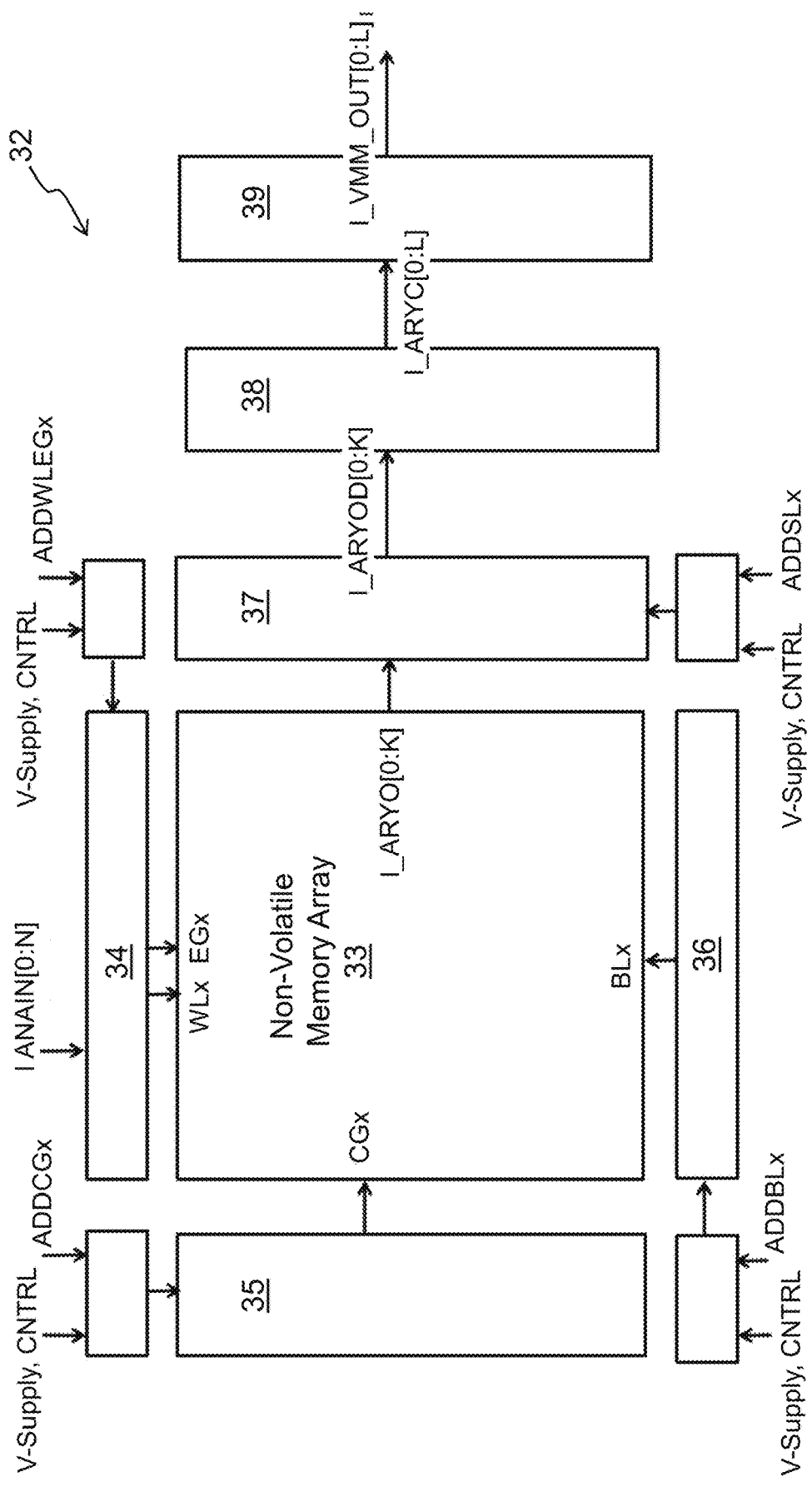
FIG. 13 is a block diagram illustrating a vector multiplier matrix.

Each level of synapses is implemented using an array, or a portion of an array, of non-volatile memory cells. FIG. 13 is a block diagram of the vector-by-matrix multiplication (VMM) array that includes the non-volatile memory cells, and is utilized as the synapses between an input layer and the next layer. Specifically, the VMM array 32 includes an array of non-volatile memory cells 33, erase gate and word line gate decoder 34, control gate decoder 35, bit line decoder 36 and source line decoder 37, which decode the inputs for the memory cell array 33. Source line decoder 37 in this example also decodes the output of the memory cell array 33. Alternatively, bit line decoder 36 can decode the output of the non-volatile memory cell array 33. The memory array serves two purposes. First, it stores the weights that will be used by the VMM array 32. Second, the memory cell array effectively multiplies the inputs by the weights stored in the memory cell array and adds together the results along each output line to produce the output, which will be the input to the next layer or input to the final layer. By performing the multiplication and addition function, the memory array negates the need for separate multiplication and addition logic circuits and is also power efficient due to its in-situ memory computation.

The output of the memory cell array is supplied to a single or differential summing circuit 38, which sums up the outputs of the memory cell array to create a single value for that convolution. The summed up output values are then supplied to the activation function circuit 39, which rectifies the output. The activation function can be sigmoid, tan h, or ReLu function. The rectified output values from circuit 39 become an element of a feature map as the next layer (C1 in the description above for example), and are then applied to the next synapse to produce next feature map layer or final layer. Therefore, in this example, the memory cell array 33 constitutes a plurality of synapses (which receive their inputs from the prior layer of neurons or from an input layer such as an image database), and summing circuit 38 and activation function circuit 39 constitute a plurality of neurons.

Figure 14:
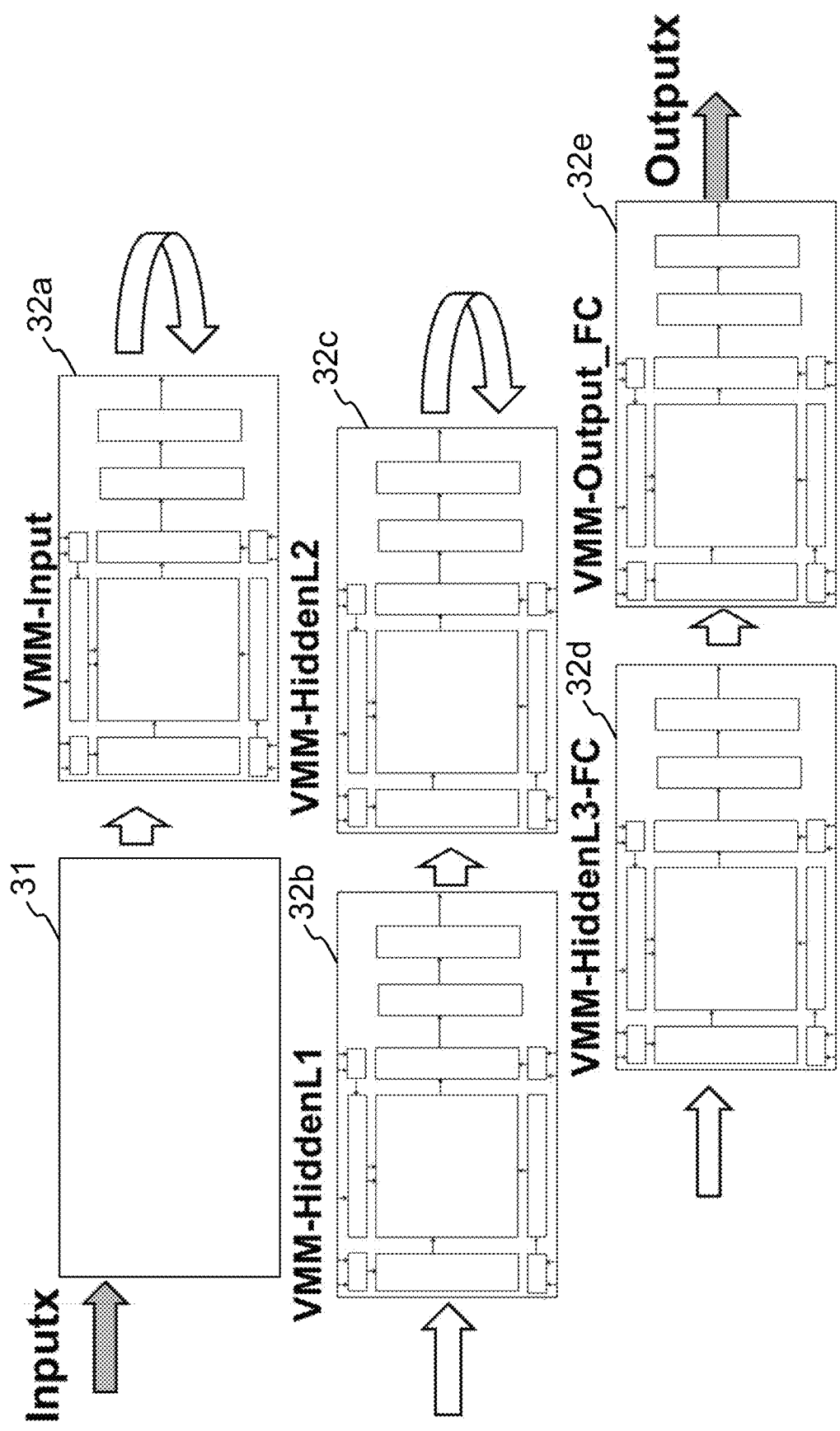
FIG. 14 is a block diagram illustrating various levels of a vector multiplier matrix.

FIG. 14 is a block diagram depicting the usage of numerous layers of VMM arrays 32, here labeled as VMM arrays 32a, 32b, 32c, 32d, and 32e. As shown in FIG. 14, the input, denoted Inputx, is converted from digital to analog by a digital-to-analog converter 31, and provided to input VMM array 32a. The output generated by the input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 14 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Figure 15:
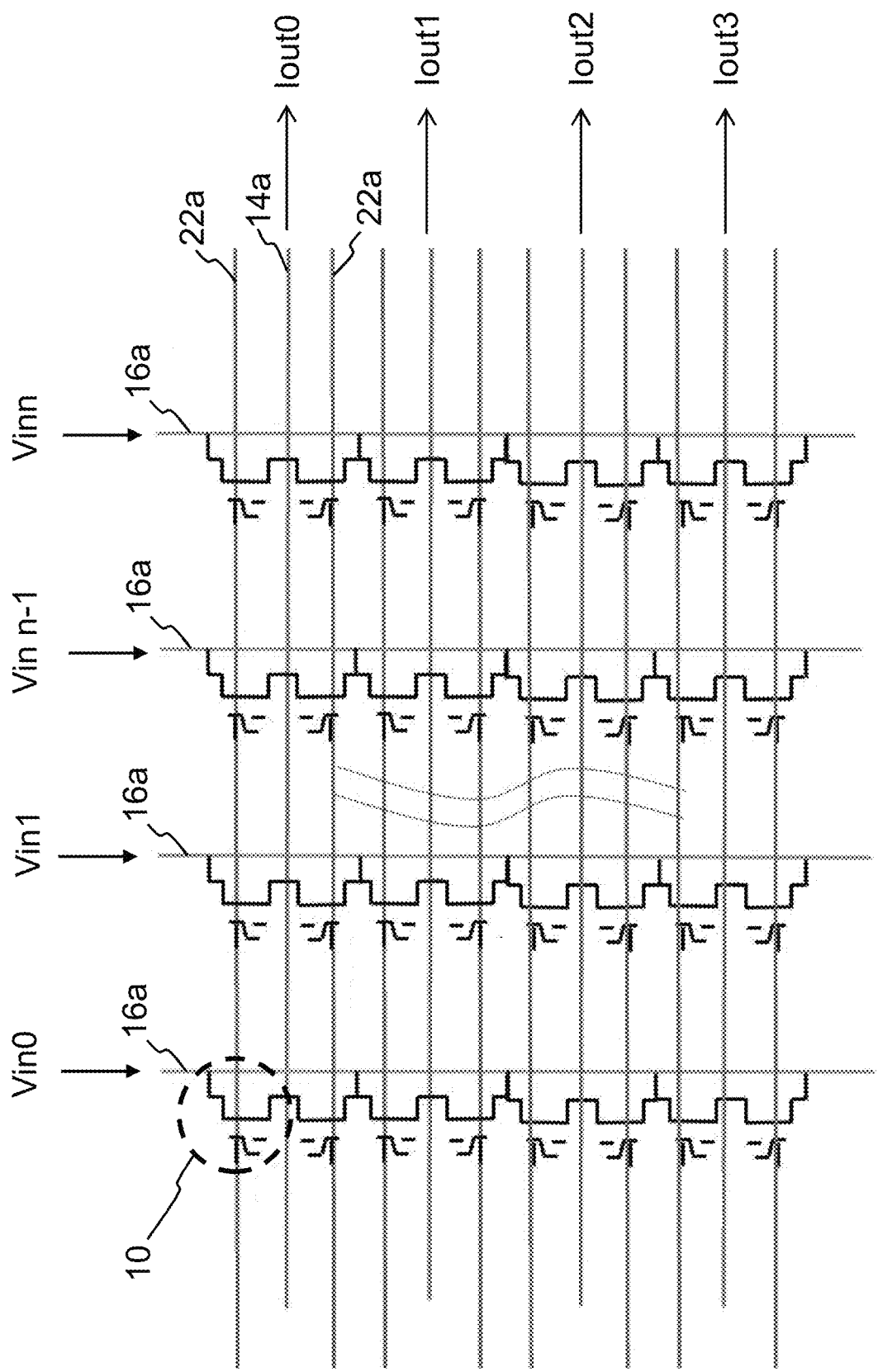
FIG. 15 is a schematic diagram illustrating a first architecture of an array of two-gate memory cells arranged as a source summing matrix multiplier.

FIG. 15 illustrates an array of two-gate memory cells 10 of FIG. 4 arranged as a source summing matrix multiplier. The various gate and region lines for the array of FIG. 15 are the same as that in FIG. 5 (with the same element numbers for corresponding structure). After each of the memory cells is programmed with the appropriate weight value for that cell, the array acts as a source summing matrix multiplier. The matrix voltage inputs are Vin0-Vinn and are placed on bit lines 16a. The matrix current outputs Iout0 . . . IoutN for the array of FIG. 15 are produced on the source lines 22a. Each output Iout is a sum of the input current I times the weight W stored in the cell, for all the cells in the row:

$$Iout=\Sigma(Ij*Wij)$$

where "i" represents the row and "j" represents the column in which the memory cell resides. In the case where a input voltage is applied instead of input current, as indicated in FIG. 15 as Vin0-Vinn, then each output Iout is proportional to the sum of the input voltage times the weight W stored in the cell, for all the cells in the row:

$$Iout\alpha\Sigma(Vj*Wij)$$

Each memory cell row acts as a single neuron having a summed weight value expressed as output current Iout dictated by the sum of the weight values stored in the memory cells in that row. The output of any given neuron is in the form of current, which can then be used as an input after adjustment by an activation function circuit for the next subsequent VMM array stage.

Figure 16:
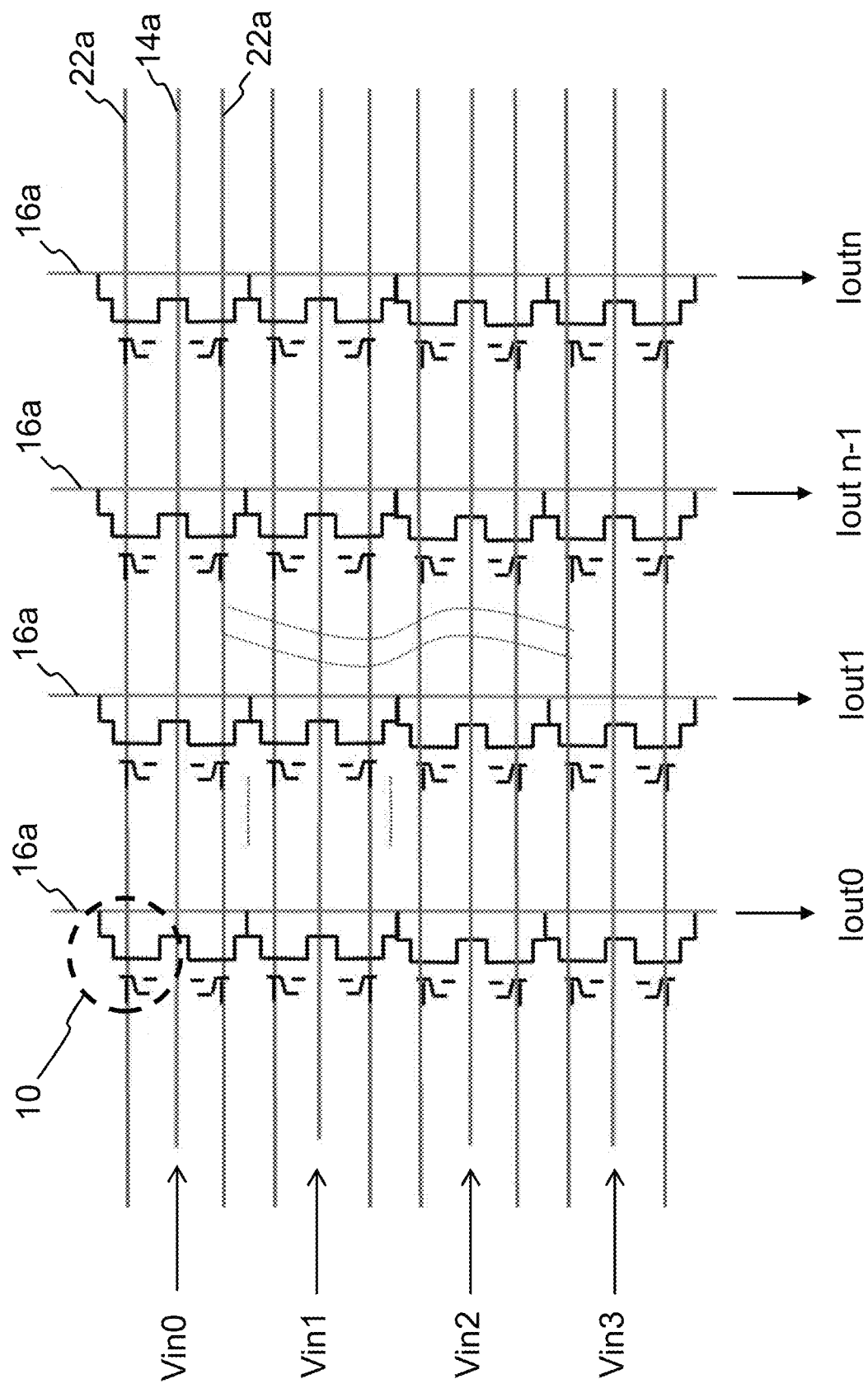
FIG. 16 is a schematic diagram illustrating a second architecture of an array of two-gate memory cells arranged as a drain summing matrix multiplier.

FIG. 16 illustrates another configuration of an array of two-gate memory cells 10 of FIG. 4 arranged as a drain (e.g., bit line of a memory array) summing matrix multiplier. The lines for the array of FIG. 16 are the same as that in the array of FIG. 15. However, the matrix voltage inputs Vin0 . . . Vin3 are placed on the source lines 14a, and the matrix current outputs Iout0 . . . IoutN are produced on the bit lines 16a (i.e., each output Iout is a sum of the cell current which is proportional to the weight W stored in the cell, for all the cells in the column). As with the previous embodiment, the output of any given neuron is in the form of current, which can then be used as an input after adjusted by an activation function circuit for the next subsequent VMM array stage.

Figure 17:
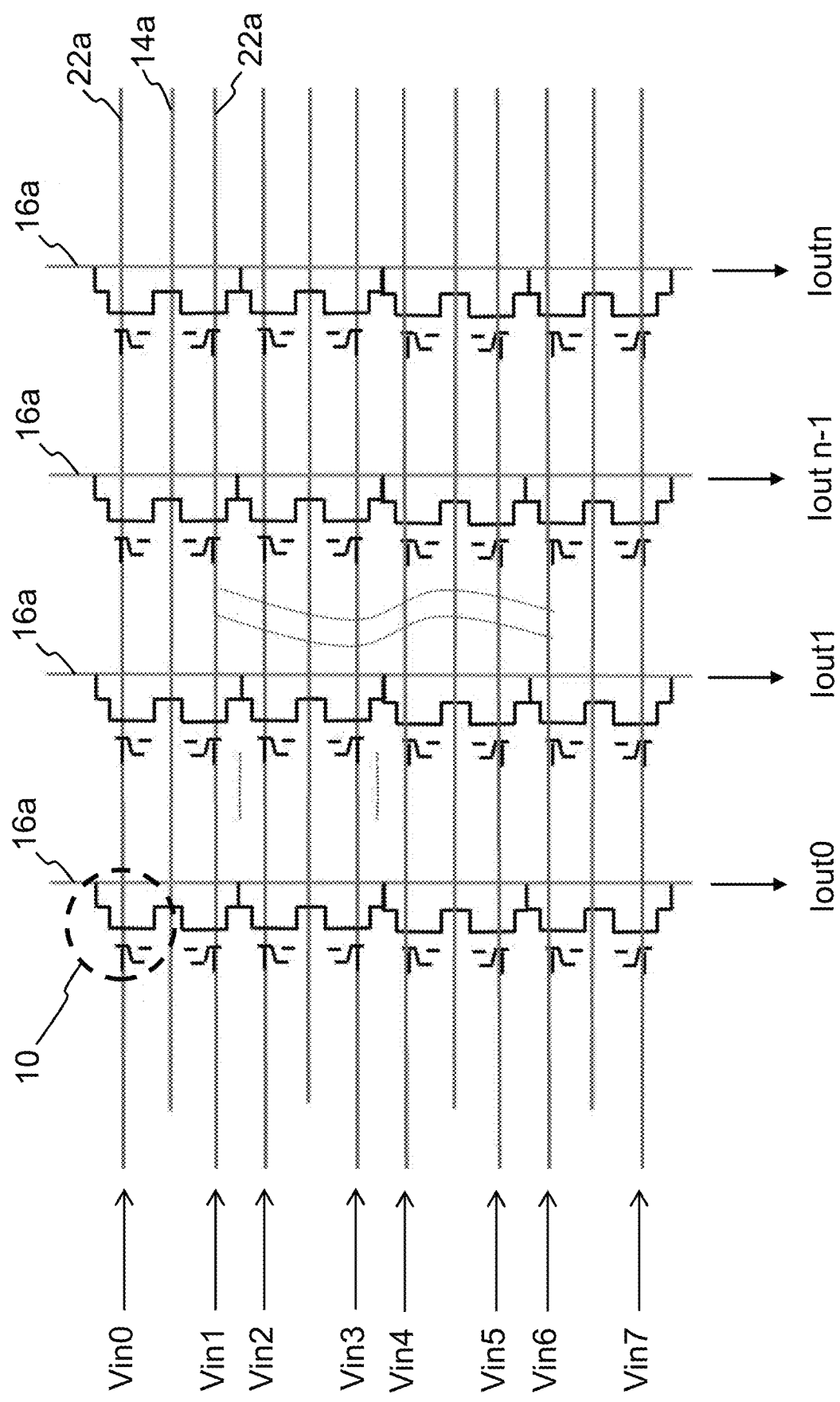
FIG. 17 is a schematic diagram illustrating a third architecture of an array of two-gate memory cells arranged as a drain summing matrix multiplier.

FIG. 17 illustrates another configuration of an array of two-gate memory cells 10 of FIG. 4 arranged as a drain summing matrix multiplier. The lines for the array of FIG. 17 are the same as that in the array of FIG. 15. However, the matrix inputs are voltages Vin0 . . . Vin7, and are placed on the control gate lines 22a, and the matrix current outputs Iout0 . . . IoutN are produced on the bit lines 16a (i.e., each output Iout is a sum of the cell current which is proportional to the weight W stored in the cell, for all the cells in the column).

Figure 18:
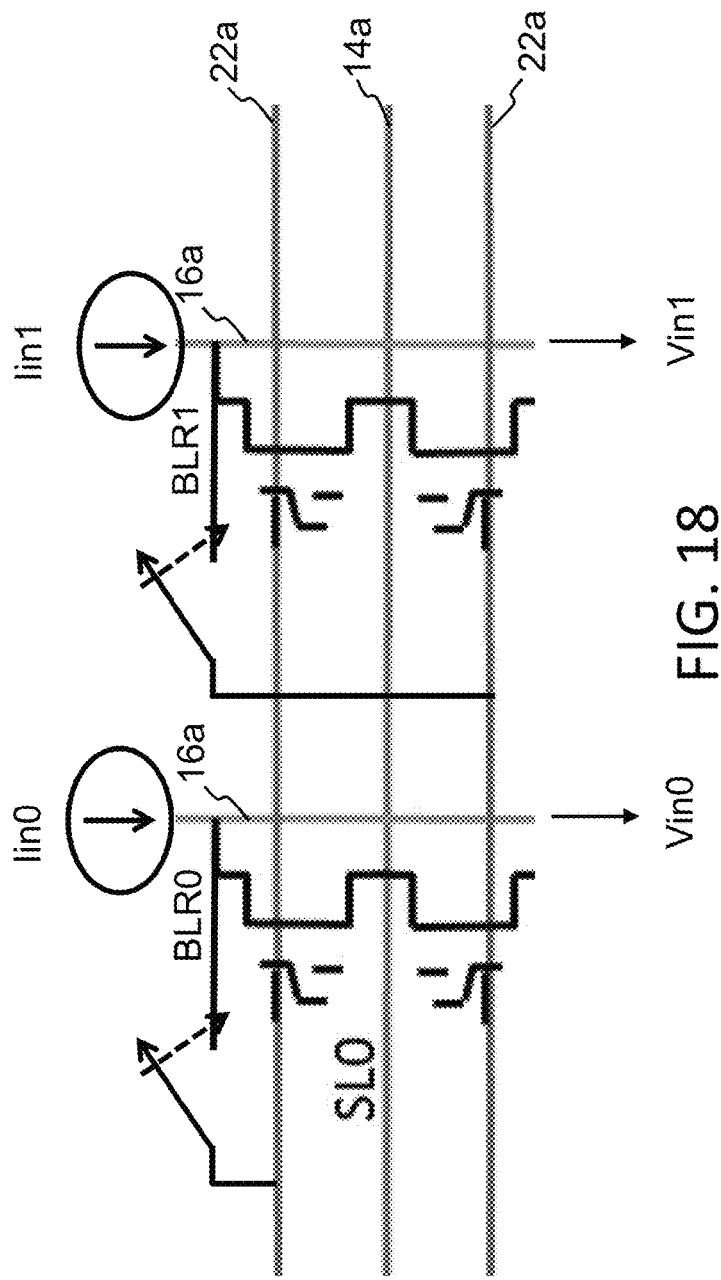
FIG. 18 is a schematic diagram illustrating a current-to-voltage converter using two-gate memory cells.

Given that the inputs are voltages, and the outputs are currents, in FIG. 17, each subsequent VMM stage after the first stage preferably includes circuitry for converting incoming currents from the previous VMM stage into voltages to be used as the input voltages Vin. FIG. 18 illustrates an example of such current-to-voltage conversion circuitry, which is a modified row of memory cells that log converts the incoming currents Iin0 . . . IinN into the input voltages Vin0 . . . VinN for application to the subsequent stage. The memory cells described herein are biased in weak inversion, $$Ids = Io * e^{(Vg-Vth)/kVt} = w * Io * e^{(Vg)/kVt}$$

where $w = e^{(-Vth)/kVt}$

For the I-to-V log converter using a memory cell to convert input current into an input voltage:

$$Vg = k * Vt * \log[Ids/wp * Io]$$

Here, wp is w of a reference or peripheral memory cell. For a memory array used as a vector matrix multiplier VMM, the output current is:

$$Iout = wa * Io * e^{(Vg)/kVt}, \text{ namely}$$

$$Iout = (wa/wp) * Iin = W * Iin$$

$$W = e^{(Vthp-Vtha)/kVt}$$

Here, wa=w of each memory cell in the memory array. A control gate line 22a can be used as the input for the memory cell for the input voltage, which is connected to the bit lines 16a by switches BLR that are closed during current to voltage conversion.

Alternatively, the non-volatile memory cells of VMM arrays described herein can be configured to operate in the linear region:

$$Ids = \text{beta} * (Vgs-Vth) * Vds; \text{ beta} = u * Cox * Wt/L,$$

where Wt and L are the width and length respectively of the transistor

W α (Vgs−Vth), meaning weight W is proportional to (Vgs−Vth)

A control gate line or bit line or source line can be used as the input for the memory cell operated in the linear region. The bit line or source line can be used as the output for the output neuron.

For an I-to-V linear converter, a memory cell (such as a reference memory cell or a peripheral memory cell) or a transistor operating in the linear region or a resistor can be used to linearly convert an input/output current into an input/output voltage. Alternatively, the non-volatile memory cells of VMM arrays described herein can be configured to operate in the saturation region:

$$Ids = \alpha \frac{1}{2} * \text{beta} * (Vgs-Vth)^2; \text{ beta} = u * Cox * Wt/L$$

W α (Vgs−Vth)$^2$, meaning weight W is proportional to (Vgs−Vth)$^2$

A control gate line can be used as the input for the memory cell operated in the saturation region. The bit line or source line can be used as the output for the output neuron. Alternatively, the non-volatile memory cells of VMM arrays described herein can be used in all regions or a combination thereof (sub threshold, linear, or saturation). Any of the above described current to voltage conversion circuits or techniques can be used with any of the embodiments herein so that the current output from any given neuron in the form of current can then be used as an input after adjusted by an activation function circuit for the next subsequent VMM array stage.

Figure 19:
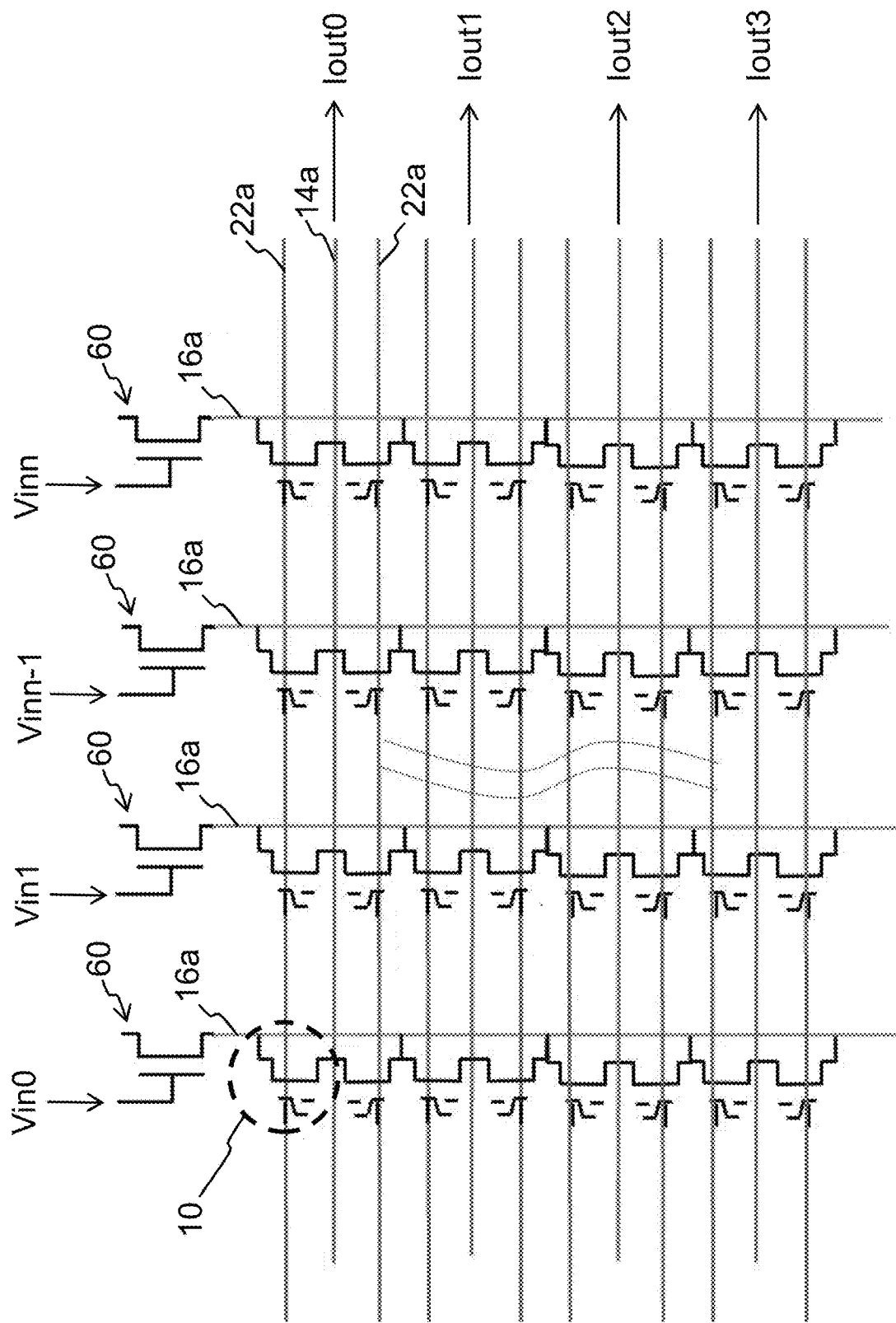
FIG. 19 is a schematic diagram illustrating a fourth architecture of an array of two-gate memory cells arranged as a source summing matrix multiplier.

FIG. 19 illustrates another configuration of an array of two-gate memory cells 10 of FIG. 4 arranged as a source summing matrix multiplier. The lines for the array of FIG. 19 are the same as that in the array of FIG. 15, except that each bit line includes a bit line buffer transistor 60 connected in series with the bit line (i.e., any current on the bit line flows through the transistor between its source and drain). The transistor 60 acts as a graduated switch that selectively and gradually turns on the bit line as the input voltage on the transistor's gate terminal is increased (i.e., the transistor couples the bit line to its current or voltage source). The matrix voltage inputs Vin0 . . . VinN are provided to the gates of the transistors 60, and the matrix current outputs Iout0 . . . Iout3 are provided on the source lines 14a. The advantage of this configuration is that the matrix inputs can be supplied as voltages (to operate transistors 60), instead of supplying inputs directly to the bit lines in the form of electrical voltages. This allows for the use of constant voltage sources to operate the bit lines, using transistors 60 to gradually couple them to the bit lines in response to the input voltages Vin supplied to the transistors' gates, thus negating the need to supply electrical voltage inputs to the memory array. As with the previous embodiments, the output of any given neuron is in the form of current, which can then be used as an input after adjusted by an activation function circuit for the next subsequent VMM array stage.

Figure 20:
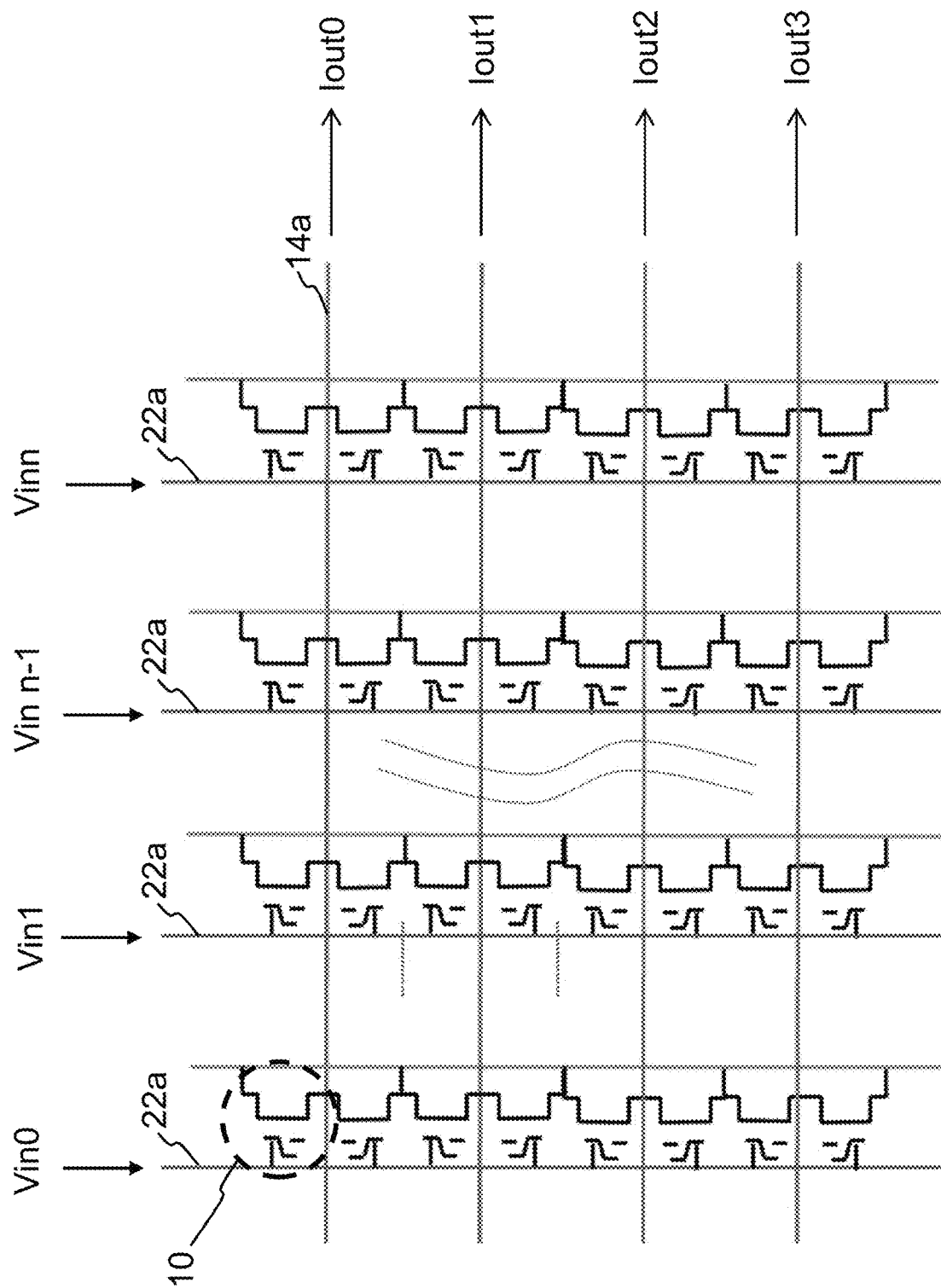
FIG. 20 is a schematic diagram illustrating a fifth architecture of an array of two-gate memory cells arranged as a source summing matrix multiplier.

FIG. 20 illustrates another configuration of an array of two-gate memory cells 10 of FIG. 4 arranged as a source summing matrix multiplier. The lines for the array of FIG. 20 are the same as that in the array of FIG. 15, except that the control gate lines 22a run vertically instead of horizontally, so that each memory cell can be independently programmed, erased and read. Specifically, each column of memory cells includes a control gate line 22a connecting together all the control gates 22 of the memory cells in that column. The matrix voltage inputs Vin0 . . . Vinn are provided on the control gate lines 22a, and the matrix current outputs Iout0 . . . Iout3 are produced on the source lines 14a. Each output Iout is a sum of the cell current that is proportional to the weight W stored in the cell, for all the cells in the row. As with the previous embodiments, the output of any given neuron is in the form of current, which can then be used as an input after adjusted by an activation function circuit for the next subsequent VMM array stage.

Figure 21:
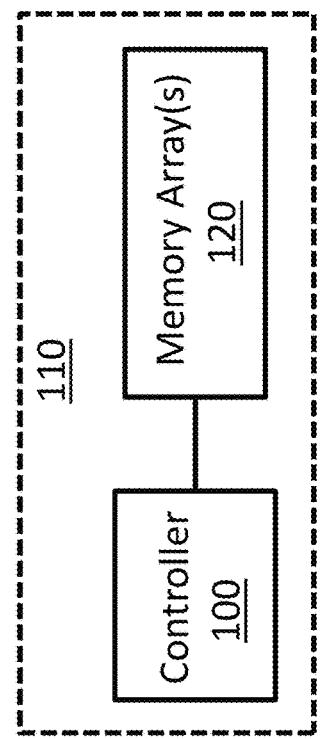
FIG. 21 is a diagram illustrating a controller on the same chip as the memory array(s) for implementing the operation of the memory array(s).

All of the above functionality can be performed under the control of a controller 100, which is connected to the memory array(s) of the above described memory cells 10 used for the neural net functionality. As shown in FIG. 21, the controller 100 is preferably on the same semiconductor chip or substrate 110 as the memory array(s) 120. However, controller 100 could also be located on a separate semiconductor chip or substrate, and could be a collection of multiple controllers disposed in different locations on or off semiconductor chip or substrate 110.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Single layers of material could be formed as multiple layers of such or similar materials, and vice versa. While the outputs of each memory cell array are manipulated by filter condensation before being sent to the next neuron layer, they need not be. Lastly, for each of the matrix multiplier array embodiments described above, for any lines not being used for the input voltages or the output currents, the nominal read voltages disclosed in the tables herein for that configuration of memory cell can be (but not necessary be) applied to those lines during operation.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A neural network device, comprising:
   a first plurality of synapses configured to receive a first plurality of inputs and to generate therefrom a first plurality of outputs, wherein the first plurality of synapses comprises:
      a plurality of memory cells, wherein each of the memory cells includes spaced apart source and drain regions formed in a semiconductor substrate with a channel region extending there between, a floating gate disposed over and insulated from a first portion of the channel region and a first gate having a first portion disposed over and insulated from a second portion of the channel region;
      each of the plurality of memory cells is configured to store a weight value corresponding to a number of electrons on the floating gate;
      the plurality of memory cells are configured to generate the first plurality of outputs based upon the first plurality of inputs and the stored weight values;
   wherein the memory cells of the first plurality of synapses are arranged in rows and columns, and wherein the first plurality of synapses comprises:
      a plurality of first lines each electrically connecting together the first gates in one of the rows of the memory cells;
      a plurality of second lines each electrically connecting together the source regions in one of the rows of the memory cells;
      a plurality of third lines each electrically connecting together the drain regions in one of the columns of the memory cells;
   wherein the first plurality of synapses is configured to receive the first plurality of inputs as electrical voltages on the plurality of third lines, and to provide the first plurality of outputs as electrical currents on the plurality of second lines.

2. The neural network device of claim 1, wherein for each of the plurality of memory cells, the first gate includes a second portion that extends up and over the floating gate.

3. The neural network device of claim 1, further comprising:
   a first plurality of neurons configured to receive the first plurality of outputs.

4. The neural network device of claim 3, further comprising:
   a second plurality of synapses configured to receive a second plurality of inputs from the first plurality of neurons and to generate therefrom a second plurality of outputs, wherein the second plurality of synapses comprises:
      a plurality of second memory cells, wherein each of the second memory cells includes spaced apart second source and second drain regions formed in the semiconductor substrate with a second channel region extending there between, a second floating gate disposed over and insulated from a first portion of the second channel region and a second gate having a first portion disposed over and insulated from a second portion of the second channel region;
      each of the plurality of second memory cells is configured to store a second weight value corresponding to a number of electrons on the second floating gate;
      the plurality of second memory cells are configured generate the second plurality of outputs based upon the second plurality of inputs and the stored second weight values;
   wherein the second memory cells of the second plurality of synapses are arranged in rows and columns, and wherein the second plurality of synapses comprises:
      a plurality of fourth lines each electrically connecting together the second gates in one of the rows of the second memory cells;
      a plurality of fifth lines each electrically connecting together the second source regions in one of the rows of the second memory cells;
      a plurality of sixth lines each electrically connecting together the second drain regions in one of the columns of the second memory cells;
   wherein the second plurality of synapses is configured to receive the second plurality of inputs as electrical voltages on the plurality of sixth lines, and to provide the second plurality of outputs as electrical currents on the plurality of fifth lines.

5. The neural network device of claim 4, wherein for each of the plurality of second memory cells, the second gate includes a second portion that extends up and over the second floating gate.

6. The neural network device of claim 4, further comprising:
a second plurality of neurons configured to receive the second plurality of outputs.

7. A neural network device, comprising:
a first plurality of synapses configured to receive a first plurality of inputs and to generate therefrom a first plurality of outputs, wherein the first plurality of synapses comprises:
a plurality of memory cells, wherein each of the memory cells includes spaced apart source and drain regions formed in a semiconductor substrate with a channel region extending there between, a floating gate disposed over and insulated from a first portion of the channel region and a first gate having a first portion disposed over and insulated from a second portion of the channel region;
each of the plurality of memory cells is configured to store a weight value corresponding to a number of electrons on the floating gate;
the plurality of memory cells are configured to generate the first plurality of outputs based upon the first plurality of inputs and the stored weight values;
wherein the memory cells of the first plurality of synapses are arranged in rows and columns, and wherein the first plurality of synapses comprises:
a plurality of first lines each electrically connecting together the first gates in one of the rows of the memory cells;
a plurality of second lines each electrically connecting together the source regions in one of the rows of the memory cells;
a plurality of third lines each electrically connecting together the drain regions in one of the columns of the memory cells;
wherein the first plurality of synapses is configured to receive the first plurality of inputs as electrical voltages on the plurality of second lines or on the plurality of first lines, and to provide the first plurality of outputs as electrical currents on the plurality of third lines.

8. The neural network device of claim 7, wherein the first plurality of synapses is configured to receive the first plurality of inputs as electrical voltages on the plurality of second lines.

9. The neural network device of claim 7, wherein the first plurality of synapses is configured to receive the first plurality of inputs as electrical voltages on the plurality of first lines.

10. The neural network device of claim 7, wherein for each of the plurality of memory cells, the first gate includes a second portion that extends up and over the floating gate.

11. The neural network device of claim 7, further comprising:
a first plurality of neurons configured to receive the first plurality of outputs.

12. The neural network device of claim 11, further comprising:
a second plurality of synapses configured to receive a second plurality of inputs from the first plurality of neurons and to generate therefrom a second plurality of outputs, wherein the second plurality of synapses comprises:
a plurality of second memory cells, wherein each of the second memory cells includes spaced apart second source and second drain regions formed in the semiconductor substrate with a second channel region extending there between, a second floating gate disposed over and insulated from a first portion of the second channel region and a second gate having a first portion disposed over and insulated from a second portion of the second channel region;
each of the plurality of second memory cells is configured to store a second weight value corresponding to a number of electrons on the second floating gate;
the plurality of second memory cells are configured generate the second plurality of outputs based upon the second plurality of inputs and the stored second weight values;
wherein the second memory cells of the second plurality of synapses are arranged in rows and columns, and wherein the second plurality of synapses comprises:
a plurality of fourth lines each electrically connecting together the second gates in one of the rows of the second memory cells;
a plurality of fifth lines each electrically connecting together the second source regions in one of the rows of the second memory cells;
a plurality of sixth lines each electrically connecting together the second drain regions in one of the columns of the second memory cells;
wherein the second plurality of synapses is configured to receive the second plurality of inputs as electrical voltages on the plurality of fifth lines or on the plurality of fourth lines, and to provide the second plurality of outputs as electrical currents on the plurality of sixth lines.

13. The neural network device of claim 12, wherein the second plurality of synapses is configured to receive the second plurality of inputs as electrical voltages on the plurality of fifth lines.

14. The neural network device of claim 12, wherein the second plurality of synapses is configured to receive the second plurality of inputs as electrical voltages on the plurality of fourth lines.

15. The neural network device of claim 12, wherein for each of the plurality of second memory cells, the second gate includes a second portion that extends up and over the second floating gate.

16. The neural network device of claim 12, further comprising:
a second plurality of neurons configured to receive the second plurality of outputs.

17. A neural network device, comprising:
a first plurality of synapses configured to receive a first plurality of inputs and to generate therefrom a first plurality of outputs, wherein the first plurality of synapses comprises:
a plurality of memory cells, wherein each of the memory cells includes spaced apart source and drain regions formed in a semiconductor substrate with a channel region extending there between, a floating gate disposed over and insulated from a first portion of the channel region and a first gate having a first portion disposed over and insulated from a second portion of the channel region;
each of the plurality of memory cells is configured to store a weight value corresponding to a number of electrons on the floating gate;
the plurality of memory cells are configured to generate the first plurality of outputs based upon the first plurality of inputs and the stored weight values;
wherein the memory cells of the first plurality of synapses are arranged in rows and columns, and wherein the first plurality of synapses comprises:

a plurality of first lines each electrically connecting together the first gates in one of the rows of the memory cells;

a plurality of second lines each electrically connecting together the source regions in one of the rows of the memory cells;

a plurality of third lines each electrically connecting together the drain regions in one of the columns of the memory cells;

a plurality of transistors each electrically connected in series with one of the third lines;

wherein the first plurality of synapses is configured to receive the first plurality of inputs as electrical voltages on gates of the plurality of transistors, and to provide the first plurality of outputs as electrical currents on the plurality of second lines.

18. The neural network device of claim 17, wherein for each of the plurality of memory cells, the first gate includes a second portion that extends up and over the floating gate.

19. The neural network device of claim 17, further comprising:

a first plurality of neurons configured to receive the first plurality of outputs.

20. The neural network device of claim 19, further comprising:

a second plurality of synapses configured to receive a second plurality of inputs from the first plurality of neurons and to generate therefrom a second plurality of outputs, wherein the second plurality of synapses comprises:

a plurality of second memory cells, wherein each of the second memory cells includes spaced apart second source and second drain regions formed in the semiconductor substrate with a second channel region extending there between, a second floating gate disposed over and insulated from a first portion of the second channel region and a second gate having a first portion disposed over and insulated from a second portion of the second channel region;

each of the plurality of second memory cells is configured to store a second weight value corresponding to a number of electrons on the second floating gate;

the plurality of second memory cells are configured to generate the second plurality of outputs based upon the second plurality of inputs and the stored second weight values;

wherein the second memory cells of the second plurality of synapses are arranged in rows and columns, and wherein the second plurality of synapses comprises:

a plurality of fourth lines each electrically connecting together the second gates in one of the rows of the second memory cells;

a plurality of fifth lines each electrically connecting together the second source regions in one of the rows of the second memory cells;

a plurality of sixth lines each electrically connecting together the second drain regions in one of the columns of the second memory cells;

a second plurality of transistors each electrically connected in series with one of the sixth lines;

wherein the second plurality of synapses is configured to receive the second plurality of inputs as electrical voltages on gates of the second plurality of transistors, and to provide the second plurality of outputs as electrical currents on the plurality of fifth lines.

21. The neural network device of claim 20, wherein for each of the plurality of second memory cells, the second gate includes a second portion that extends up and over the second floating gate.

22. The neural network device of claim 20, further comprising:

a second plurality of neurons configured to receive the second plurality of outputs.

23. A neural network device, comprising:

a first plurality of synapses configured to receive a first plurality of inputs and to generate therefrom a first plurality of outputs, wherein the first plurality of synapses comprises:

a plurality of memory cells, wherein each of the memory cells includes spaced apart source and drain regions formed in a semiconductor substrate with a channel region extending there between, a floating gate disposed over and insulated from a first portion of the channel region and a first gate having a first portion disposed over and insulated from a second portion of the channel region;

each of the plurality of memory cells is configured to store a weight value corresponding to a number of electrons on the floating gate;

the plurality of memory cells are configured to generate the first plurality of outputs based upon the first plurality of inputs and the stored weight values;

wherein the memory cells of the first plurality of synapses are arranged in rows and columns, and wherein the first plurality of synapses comprises:

a plurality of first lines each electrically connecting together the first gates in one of the columns of the memory cells;

a plurality of second lines each electrically connecting together the source regions in one of the rows of the memory cells;

a plurality of third lines each electrically connecting together the drain regions in one of the columns of the memory cells;

wherein the first plurality of synapses is configured to receive the first plurality of inputs as electrical voltages on the plurality of first lines, and to provide the first plurality of outputs as electrical currents on the plurality of second lines.

24. The neural network device of claim 23, wherein for each of the plurality of memory cells, the first gate includes a second portion that extends up and over the floating gate.

25. The neural network device of claim 23, further comprising:

a first plurality of neurons configured to receive the first plurality of outputs.

26. The neural network device of claim 25, further comprising:

a second plurality of synapses configured to receive a second plurality of inputs from the first plurality of neurons and to generate therefrom a second plurality of outputs, wherein the second plurality of synapses comprises:

a plurality of second memory cells, wherein each of the second memory cells includes spaced apart second source and second drain regions formed in the semiconductor substrate with a second channel region extending there between, a second floating gate disposed over and insulated from a first portion of the second channel region and a second gate having a first portion disposed over and insulated from a second portion of the second channel region;

each of the plurality of second memory cells is configured to store a second weight value corresponding to a number of electrons on the second floating gate;

the plurality of second memory cells are configured generate the second plurality of outputs based upon the second plurality of inputs and the stored second weight values;

wherein the second memory cells of the second plurality of synapses are arranged in rows and columns, and wherein the second plurality of synapses comprises:

a plurality of fourth lines each electrically connecting together the second gates in one of the columns of the second memory cells;

a plurality of fifth lines each electrically connecting together the second source regions in one of the rows of the second memory cells;

a plurality of sixth lines each electrically connecting together the second drain regions in one of the columns of the second memory cells;

wherein the second plurality of synapses is configured to receive the second plurality of inputs as electrical voltages on the plurality of fourth lines, and to provide the second plurality of outputs as electrical currents on the plurality of fifth lines.

27. The neural network device of claim 26, wherein for each of the plurality of second memory cells, the second gate includes a second portion that extends up and over the second floating gate.

28. The neural network device of claim 26, further comprising:

a second plurality of neurons configured to receive the second plurality of outputs.

* * * * *